US008113763B2

(12) United States Patent
Hagenbuch et al.

(10) Patent No.: US 8,113,763 B2
(45) Date of Patent: Feb. 14, 2012

(54) PROCESS FOR THREE-DIMENSIONAL MODELING AND DESIGN OF OFF-HIGHWAY DUMP BODIES

(75) Inventors: LeRoy G. Hagenbuch, Peoria, IL (US); Philip T. Brinkman, Canton, IL (US)

(73) Assignee: Philippi-Hagenbuch, Inc., Peoria, IL (US)

( * ) Notice: Subject to any disclaimer, the term of this patent is extended or adjusted under 35 U.S.C. 154(b) by 0 days.

(21) Appl. No.: 12/106,794

(22) Filed: Apr. 21, 2008

(65) Prior Publication Data
US 2008/0193273 A1    Aug. 14, 2008

Related U.S. Application Data

(63) Continuation of application No. 09/593,647, filed on Jun. 13, 2000, now Pat. No. 7,369,978, which is a continuation-in-part of application No. 09/333,379, filed on Jun. 15, 1999, now Pat. No. 7,412,357.

(51) Int. Cl.
*B65G 67/04* (2006.01)
*B60P 1/04* (2006.01)

(52) U.S. Cl. ............ 414/809; 296/183.2; 298/1 R; 414/397

(58) Field of Classification Search ........... 296/26.03, 296/183.2; 298/23 R, 1 R; 701/124; 414/397, 414/809
See application file for complete search history.

(56) References Cited

U.S. PATENT DOCUMENTS 3,890,006 A *   6/1975   Stockwell .............. 298/23 D
4,190,265 A     2/1980   Goodbary et al.

(Continued)

FOREIGN PATENT DOCUMENTS
WO    WO 00/76805 A1    12/2000

OTHER PUBLICATIONS

Duff, Elliot, "Automated Volume Measurement of Haul-Truck Loads", *CSIRO Manufacturing Science and Technology, Presented at Open Coal Cut Operations Conference*, Mackay, Queensland, Jun. 16, 2000.

(Continued)

*Primary Examiner* — James Keenan

(74) *Attorney, Agent, or Firm* — Leydig, Voit & Mayer, Ltd.

(57) ABSTRACT

A method of loading material into a dump body of a truck using a loading bucket whose volumetric capacity is approximately ⅓ or more than that of the dump body is provided. The dump body having side walls that are spaced relatively wider than conventional dump bodies. The loading bucket having a gate at a lower end thereof that when free swings open and causes the material contained in the loading bucket to drop into the dump body. The method including the steps of filling the loading bucket with an amount of earthen material and centering the loading bucket over the dump body. The bucket is then lowered to a position that: (1) substantially minimizes the clearance between the floor of the dump body and the swinging gate in its freed position; (2) allows the swinging gate to clear the side walls of the dump body as it swings through an arc after it is freed, and (3) allows the material to be discharged substantially in the center of the dump body. The swinging gate is then freed so as to open the bucket and allow the material held in the bucket to drop into the dump body.

6 Claims, 28 Drawing Sheets

U.S. PATENT DOCUMENTS

| | | | |
|---|---|---|---|
| 4,392,769 A * | 7/1983 | Lowery | 414/397 |
| 4,614,477 A | 9/1986 | Hagenbuch | |
| 4,684,152 A | 8/1987 | Goodbary et al. | |
| 4,691,792 A | 9/1987 | Shintani | |
| 4,813,004 A | 3/1989 | Fujika et al. | |
| 5,259,322 A | 11/1993 | Dominguez et al. | |
| 5,297,920 A * | 3/1994 | Pomerville et al. | 414/376 |
| 5,404,661 A | 4/1995 | Sahm et al. | |
| 5,474,363 A | 12/1995 | Hagenbuch | |
| 5,531,122 A | 7/1996 | Chatham et al. | |
| 5,650,930 A | 7/1997 | Hagenbcuh | |
| 5,815,960 A | 10/1998 | Soczka | |
| 5,844,564 A | 12/1998 | Bennis et al. | |
| 5,857,825 A | 1/1999 | Rice | |
| 5,887,914 A | 3/1999 | Hagenbuch | |
| 5,936,869 A | 8/1999 | Sakaguchi et al. | |
| 6,022,068 A | 2/2000 | D'Amico | |
| 6,106,072 A | 8/2000 | Lutter, Jr. | |
| 6,157,889 A | 12/2000 | Baker | |
| 6,313,414 B1 | 11/2001 | Campbell | |
| 6,374,201 B1 | 4/2002 | Grizon et al. | |
| 6,565,146 B2 * | 5/2003 | Fujan et al. | 296/183.2 |
| 6,616,400 B1 * | 9/2003 | Caponey | 414/809 |
| 7,257,467 B2 | 8/2007 | Hagenbuch | |

OTHER PUBLICATIONS

Hagenbuch, LeRoy G., SME Preprint 02-137 entitled "*Off-Highway Truck Body True Capacity . . . Why Can't I Get Rated Payload on My Off-Highway Truck Without Hungry Boards and Tail Extensions*".

"Capacity Rating—Dumper Body and Trailer Body—SAE J1363 Nov. 95," *1999 SAE Handbook—Volume 3 On-Highway Vehicles and Off-Highway Machinery, Society of Automotive Engineers, Inc.*

"Earth-Moving Machinery-Dumper Bodies—Volumetric Rating," *International Standard ISO 6483*; 1980, p. 1-5.

"Komatsu Price Changes," *Equipment Watch Price Alert*, Aug. 2002.

Komatsu 930E-2 truck spec sheet, Jun. 2002.

"Caterpillar Price Changes," *Equipment Watch Price Alert*, Jan. 2003.

Caterpillar 777D Off-Highway Truck, spec sheet, Jun. 2000.

"Mining Lifts Goldfields Crane Hire," *Australia Mining Monthly*; Dec. 2002, p. 67.

"Detroit Diesel—We'll Move Mountains for You," *Australia Mining Monthly*; Aug. 2003.

"Trucks & Shovels," *World Mining Equipment*; Sep. 2003, vol. 27, No. 7 (including Komatsu PC 3000 ad and truck/shovel loading photos).

*North American Quarry News*, 2003-DBT Mineral Processing ad.

*Mining Engineer*, front cover; May 2003.

"P&H 2800 XP Shovel," *Perspective in Mining*, vol. 7, No. 2, p. 4.

"Excavator Selection," *Peak & Performance Practices*, front cover.

"Angles of Repose (Heap)"; Chart, Philippi-Hagenbuch, Inc. 2003.

Oner, Mete, "Deep Dark Secrets of Geotechnical Engineering," *EJGE/Magazine*, Internet article 1997; p. 1-4.

"B.2.60 Angle of Repose," web page from *Michigan State University Department of Physics and Astronomy Lecture Demonstrations Databases*, downloaded Sep. 28, 2003.

"Angle of Repose," web page from *Michigan Tech University*, downloaded Sep. 28, 2003.

"Angle of Repose," web page from *NCSU Physics DemoRoom*, downloaded Sep. 28, 2003.

"Angle of Repose and Angle of Marginal Stability," web page from http://www.hlrs.de/people/mueller/papers/parallelMD99/node3.html, downloaded Sep. 28, 2003.

"Angle of Repose," web page from www.HyperDictionary.com, downloaded Sep. 28, 2003.

"Angle of Repose," web page from *University of Texas at Austin Physics Department*, downloaded Sep. 28, 2003.

Faris, Roger, "Find Your Safe Angle of Repose," internet article from *The Seattle Press*, downloaded Sep. 28, 2003.

"Mass Wasting and the Angle of Repose," internet article from http://phoenix.liuent.edu/~divernere/notes/angle_of_repose.htm; p. 1-3, downloaded Sep. 28, 2003.

Angle of Repose diagram from Brunner Mond, undated.

"Angle of Repose," charts from web page http://www.geol.umd.edu/~kaufman/ppt/chapter8/sId006.htm; p. 1-2, downloaded Oct. 4, 2003.

Lee, J. et al., "Angle of Repose and Angle of Marginal Stability: Molecular Dynamics of Granular Particles," abstract article from www.IOP.org/EJ/abstract/0305-4470/26/2/01; p. 1-2, Jan. 21, 1993.

"Angle of Repose," web page from www.RCRC.nm.org/glossary/gl-angle-of-repose.html, downloaded Sep. 28, 2003.

Olson, C.J. et al., "Effect of Grain Geometry on Angle of Repose and Dynamics," internet article from www.eps.org/aps/meet/MAR01/baps/abs/S338005.html, downloaded Sep. 28, 2003.

"Effect of Water on the Angle of Repose," slide 2 of 35 from internet site www.ideo.columbia.edu/dees/ees/ies2/masswasting/sId002.html, downloaded Sep. 28, 2003.

"Dynamics Angles of Repose," internet article from http://groups.physics.umn.edu/sand/theory.shtml; p. 1-2, downloaded Sep. 28, 2003.

Morisawa, Marie, "Stable Angles of Slopes," from www.beloit.edu/~SEPM/EArth_Works/Stable_angles_of_slopes.html; p. 1-4, downloaded Sep. 28, 2003.

Park, Brien, "What do you suppose is the "angle of repose"?," web article from www.nps.gov/brca/Geodetect/Earth%20Systems/angle%20of%20repose.htm; p. 1-4, Jul. 9, 2002.

"Sand Angels," web article from www.edgerton.org/kidscorner/sandangels.html; p. 1-2, downloaded Sep. 28, 2003.

Excerpt from "Highways in the River Environment," p. 1-4; 1975.

"Sand Piles," web page from http://van.hep.uiuc.edu/van/qa/section/Everything_Else/Hard_to_Categorize/924816567.htm, downloaded Sep. 28, 2003.

"Slope Stability Lab," web page from www.geo.arizona.edu/K-12/azpepp/education/activity/la.html; p. 1-4, downloaded Sep. 28, 2003.

"The Angle of Repose and the Static Coefficient of Friction," web page from www.redcompservices.com/Pcourses/Phys1/repose.htm; p. 1-2, downloaded Sep. 28, 2003.

Prompalagorn, Wiroj et al., "Priction Coefficient & Angle of Repose Equipments," web abstract from http://library.kmitnb.ac.th/projects/eng/MHT/mht0096e.html, 1996.

"Slope Stability Lab," p. 1-4 (undated).

"Angle of Repose," slide 3 of presentation, http://www3.uakron.edu/geography/lrb/physf97/lectures/masswaste/sId003.htm, downloaded Sep. 28, 2003.

Chase, George G., "Solids Notes," University of Akron (undated), pp. 4-1 and 4-2.

"Mass Wasting," (undated); p. 1-7.

"CHASM: Cone Handling Algorithms for Stockpile Modeling," web article from www.cmis.csiro.au/PPI/RecentProjects/CHASM.htm; p. 1-3, downloaded Sep. 28, 2003.

"Axial Segregation in Binary Granular Flows," abstract from www.aae.uiuc.edu/floatn/C%20PROJ/pp02-03f.htm; p. 1-2, downloaded Sep. 28, 2003.

Bulk-Store Structures Inc. internet brochure from www.bulk-store.ca/fert.html; p. 1-3; 2000.

Commercial Hopper Tank Storage Capacities and Heights spec sheet; 2002.

"Volcanism Behind the Main Arc," web page from www.rci.rutgers.edu/~carr/fieldtrip/fieldtext/cuilapa_fldtxt.htm, downloaded Sep. 28, 2003.

"Screening Equipment," SMICO Manufacturing web page www.smico.com, downloaded Oct. 1, 2003.

"Material Bulk Density Reference Chart," SMICO Manufacturing; p. 1-20 (undated).

Hudson, Ralph G., *The Engineers' Manual*; Second Edition 1963; p. 101-102.

"Storage of Farm Crops," *Agricultural Engineers' Handbook*; p. 691, 1961.

"Approximate Angle of Repose of Various Materials," *Caterpillar Performance Handbook*; Jan. 1972, p. 25.

"Tables—Angle of Repose of Various Materials," *Caterpillar Performance Handbook*, Oct. 2002, p. 26-1.

"Material Angles of Repose," chart from Philippi-Hagenbuch, Inc., 2003.

Photographs from Caterpillar brochures featuring: 785 Truck (4-88)—AEHQ7006 (undated).

Photographs from Caterpillar brochures featuring 785C Mining Truck (4-02)-AEHQ5328-02 (undated).
Photographs from Caterpillar brochures featuring 785/789 Truck (AEDK1468) (undated).
Photographs from Caterpillar brochures featuring 775B Truck (4-94)-AEHQ3874 (undated).
Photographs from Caterpillar brochures featuring 773E Truck (11-01)-AEHQ5456 (undated).
Photographs from Caterpillar brochures featuring 775E Truck (11-01)-AEHQ5457 (undated).
"Density of Common Materials," *The Excavators 5th Edition—Hitachi*; sections 11-36:11-39 (undated).
"Tables: Weight of Materials," *Caterpillar Performance Handbook Edition 33*, Oct. 2002.
Caterpillar General Dimensions 769B Truck (undated).
Caterpillar Body Assembly 769B Truck (undated).
Sideview drawing showing Ten Different Load Configurations—Load Heaps for the Caterpillar 769B Body, created by Philippi-Hagenbuch, 2003.
1.7:1 Heap (1:1 at rear) 30.2 cu yd.
1.7:1 (True Heap) 27.5 cu yd.
1.7:1 Profiled Heap (to a point) 26.0 cu yd.
1.7:1 Profiled Heap (with top plateau) 25.8 cu yd.
"3M Mining" advertisement in *Mining Monthly*; Aug. 2003.
CSIRO—Common Wealth Scientific & Industrial Research Organization of Australia; website home page, downloaded Oct. 5, 2003.
"New Technology to Measure Mining Haul Truck Loads," CSIRO Press Release Jul. 1, 2003.
"New Technology to Measure Mining Haul Truck Loads," article from http://www.cmit.cisro.au/innovation/2003.08; p. 1-2, downloaded Aug. 22, 2003.
"A Proud History," *Euclid Haulers* brochure; p. 2; 1988.
"2:1 Heap," *Euclid-Hitachi* brochure; p. 4; 1995.
"2:1 SAE Heap," *Euclid-Hitachi* brochure; p. 4; 1999.
"2:1 SAE—Euclid R130," *VME Americas Inc.*; p. 4, 1989.
"2:1 SAE—Euclid R190," *VME Americas Inc.*; p. 4; 1990.
"2:1 SAE—Euclid R25," *Euclid Inc.*; 1982.
"2:1 Field Heap—Euclid R35," *Euclid Inc.*; 1983.
"SAE 2:1 Rated Heap," *VME Industries North America*; 1992.
Caterpillar, "*Mine Specific Design (MSD) Body Program*". from CD distributed Oct. 2000 at Mine Expo 2000.
Conymet, "*Photometry Software Tool for Volumetric and Load Distribution Study*", downloaded from www.conymet.com; Nov. 26, 2002.
Conymet, "*High Efficiency Body (HE Series)*", from presentation given May 2002 at Haulage 2002 Conference.
Disca. "*DT-HILOAD Haulage 2002*", from presentation given May 2002 at Haulage 2002 Conference.

Angles of Repose Diagrams, updated (created after filing date of present application).
Caterpillar 769B Truck product brochure; Aug. 1966.
Caterpillar 769B Truck product brochure specification; undated (applicants believe available in the late 1960's to early 1970's).
Caterpillar 769 B Truck product brochure; Mar. 1974.
Hagenbuch, LeRoy G., "Adapting the Off-Highway Truck Body Volumetric Process to Real World Conditions", *SAE Technical Paper Series, 2000*; undated (applicants believe available in the late 1960's to early 1970's).
International Organization for Standardization, ISO 6483-1980 (E), "Earth Moving Machinery-Dumper Bodies—Volume Rating", Sep. 15, 1980.
Society of Automotive Engineers, Inc. SAE Construction, Agricultural and Off-Road Machinery Standards Manual HS-2800, "Capacity Rating—Dumper Body and Trailer Body". Jan. 1985, pp. 380-381.
Liffman, Kurt, et al., "Stress in Sandpiles" *Second international Conference on CFD in Minerals and Process Industries, CSIRO*, Melborne Australia, Dec. 6-8, 1999, pp. 83-88.
Singh, Sanjiv, "The State of the Art in Automation of Earthmoving" *ACSE Journal of Aerospace Engineering* vol. 10 No. 4, Oct. 1997, pp. 1-29.
Fesak, George, et al., "Analysis of Surface Powered Haulage Accidents", *Mine Safety and Health Administration, US Department of Labor*, Sep. 1996, 11 pages including cover page.
Stentz, Antony, et al., "A Robotic Excavator for Autonomous Truck Loading", *Autonomous Robots 7*, 1999, pp. 175-186.
"Four "A" Size Isometric Drawings displaying one each possible 1.7:1 load configuration-load heap," for the Caterpillar 769B Truck; created by Philippi-Hagenbuch, 2003.
Selected chars and diagrams from Philippi-Hagenbuch, Inc. Presentation, undated (created after filed of present application).
Caterpillar, Inc. Product Division, Filed Representative Information Release, N149F, "769 Series B Truck", Aug. 24, 1966, pp. 1-21.
Caterpillar, Inc. Brochure AE026730, "Caterpillar 769 Series B", Applicants believe available in 1967.
Caterpillar Inc., Brochure AEHQ5186 Caterpillar 793C Mining Truck,: Copyright 1996.
Euclid Inc., Form 12-015 "Euclid R-85 Specifications," Aug. 1977.
Euclid Inc., Form 12-028 "Euclid R-85 Hauler Specifications," Sep. 1985.
VME Americas Inc., Form RH-483 "Euclid R85 B," Jan. 1919.
Euclid Inc., From RH-483 R1 ; "Euclid R85B Haul Units," Aug. 1994.

* cited by examiner

Step 6

Step 8

Based on the specific customer information and the resulting load profile, a three dimensional model is developed which incorporates the actual side, front and rear angles of material repose and corner voids.

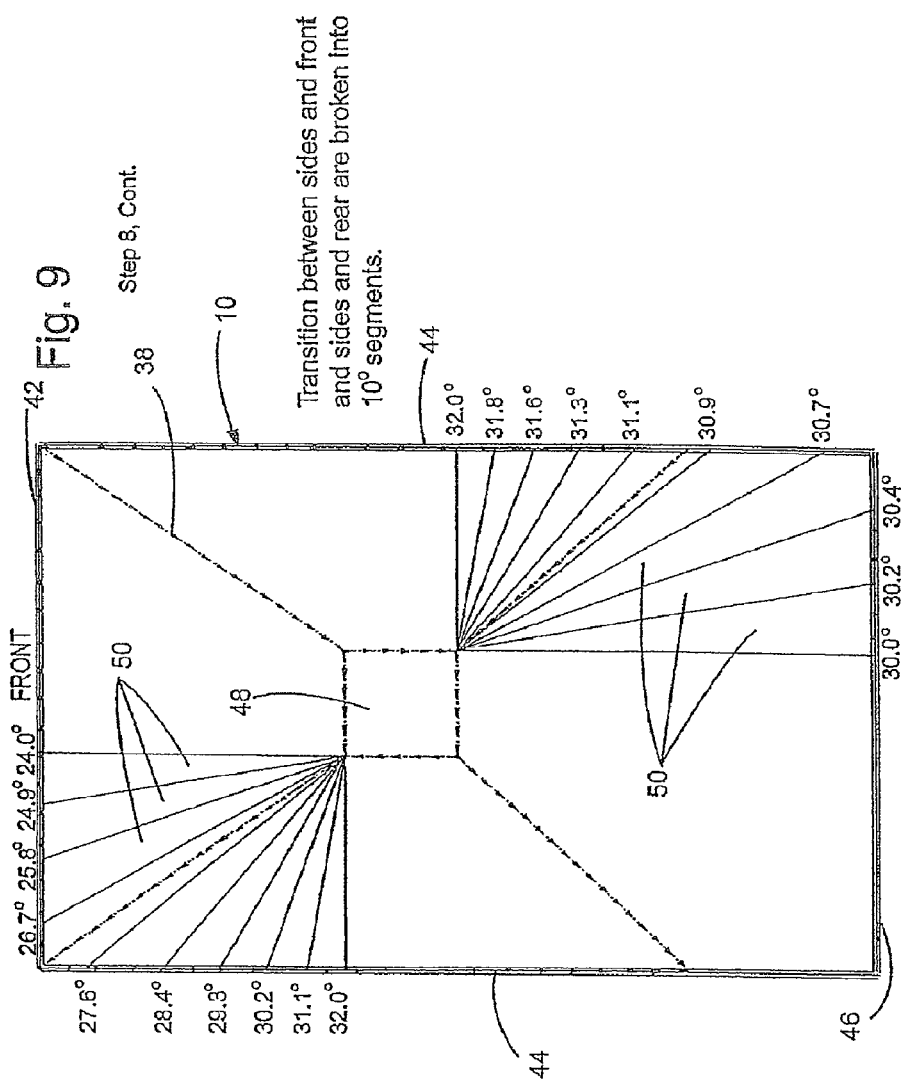

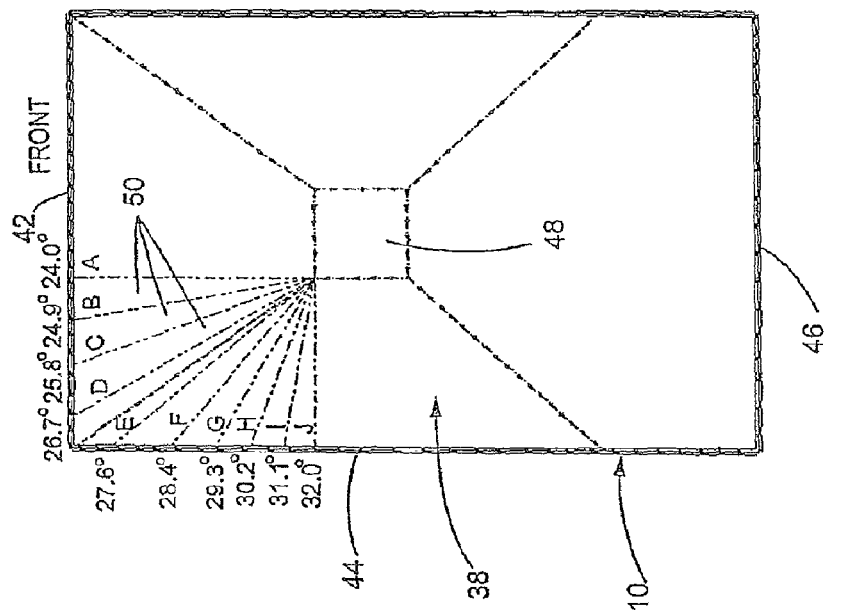
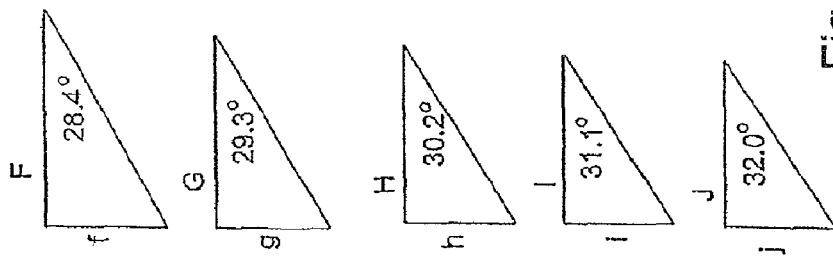
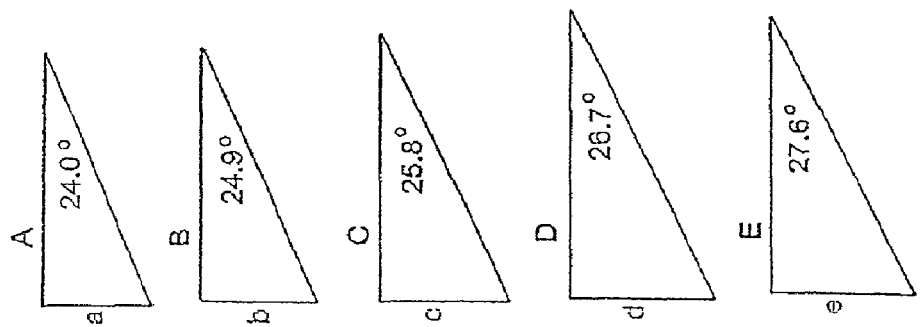
Fig. 10A

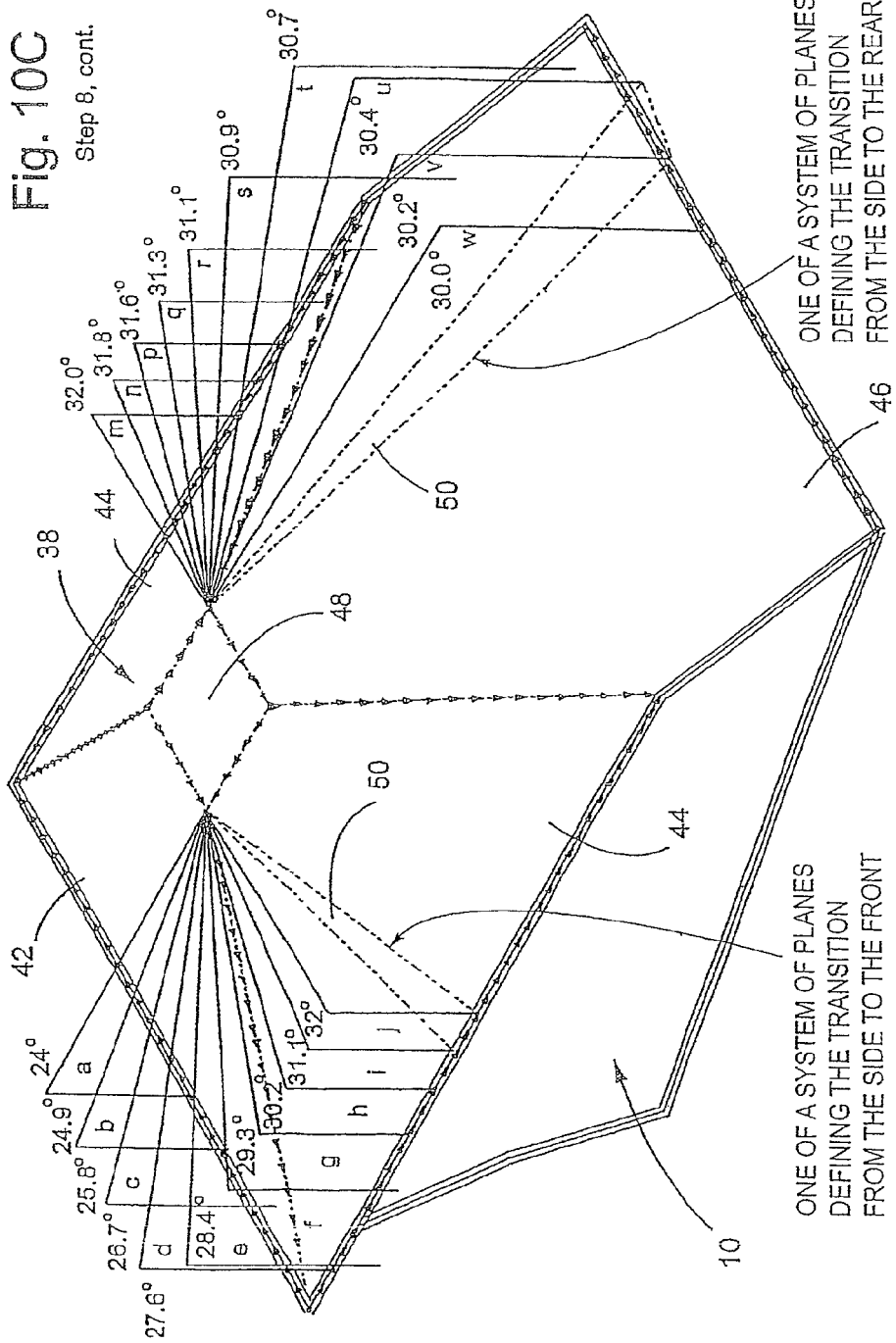
Fig. 10C Step 8, cont.

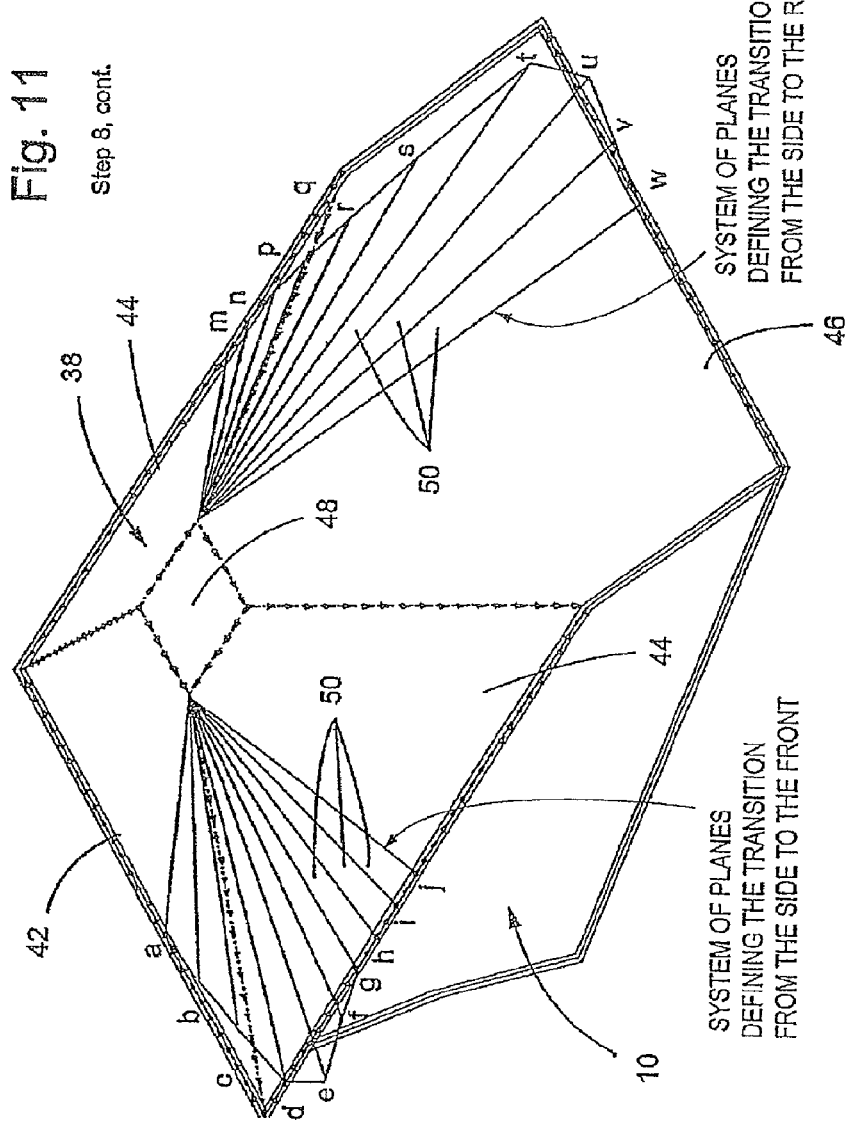

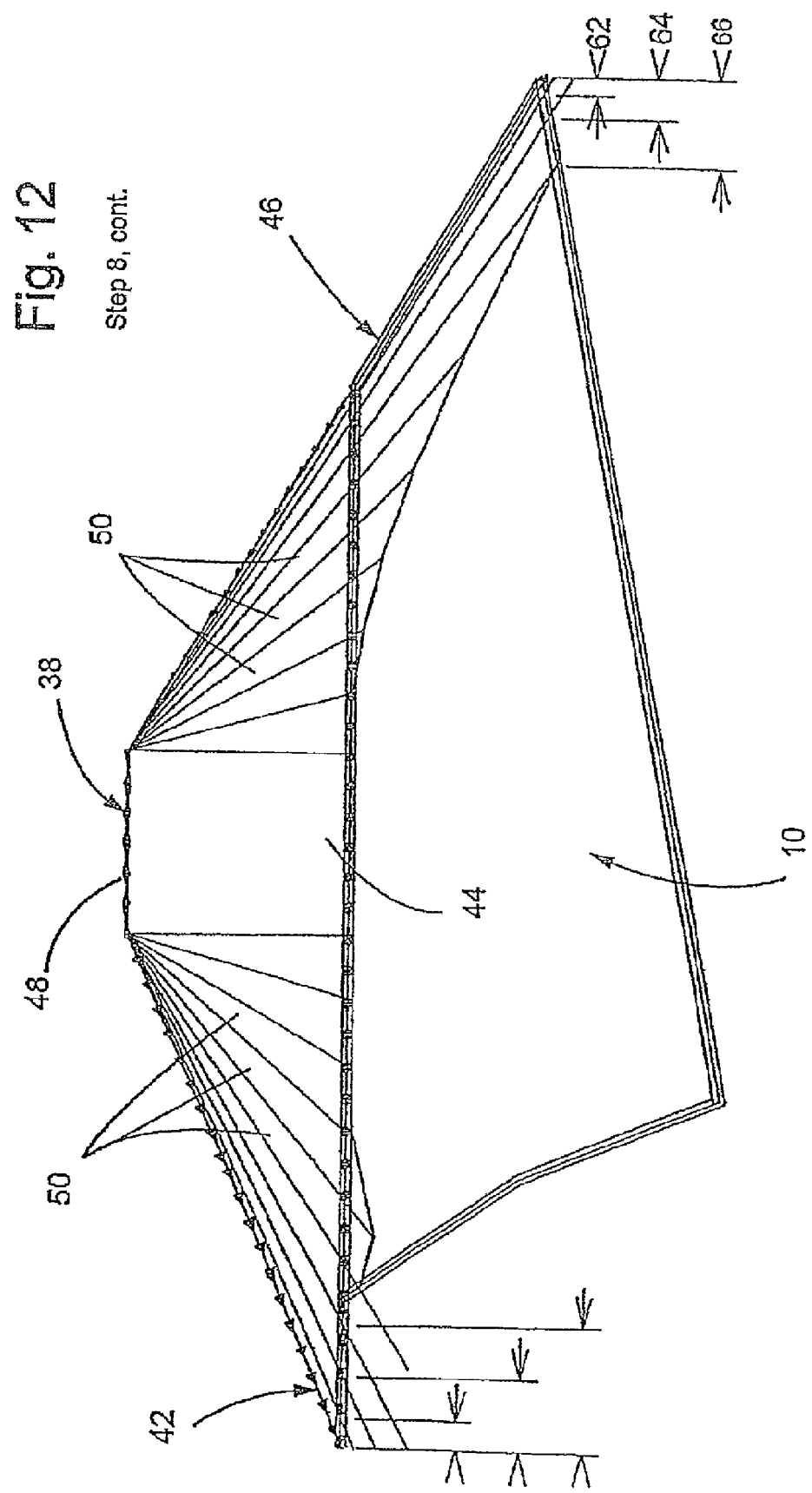

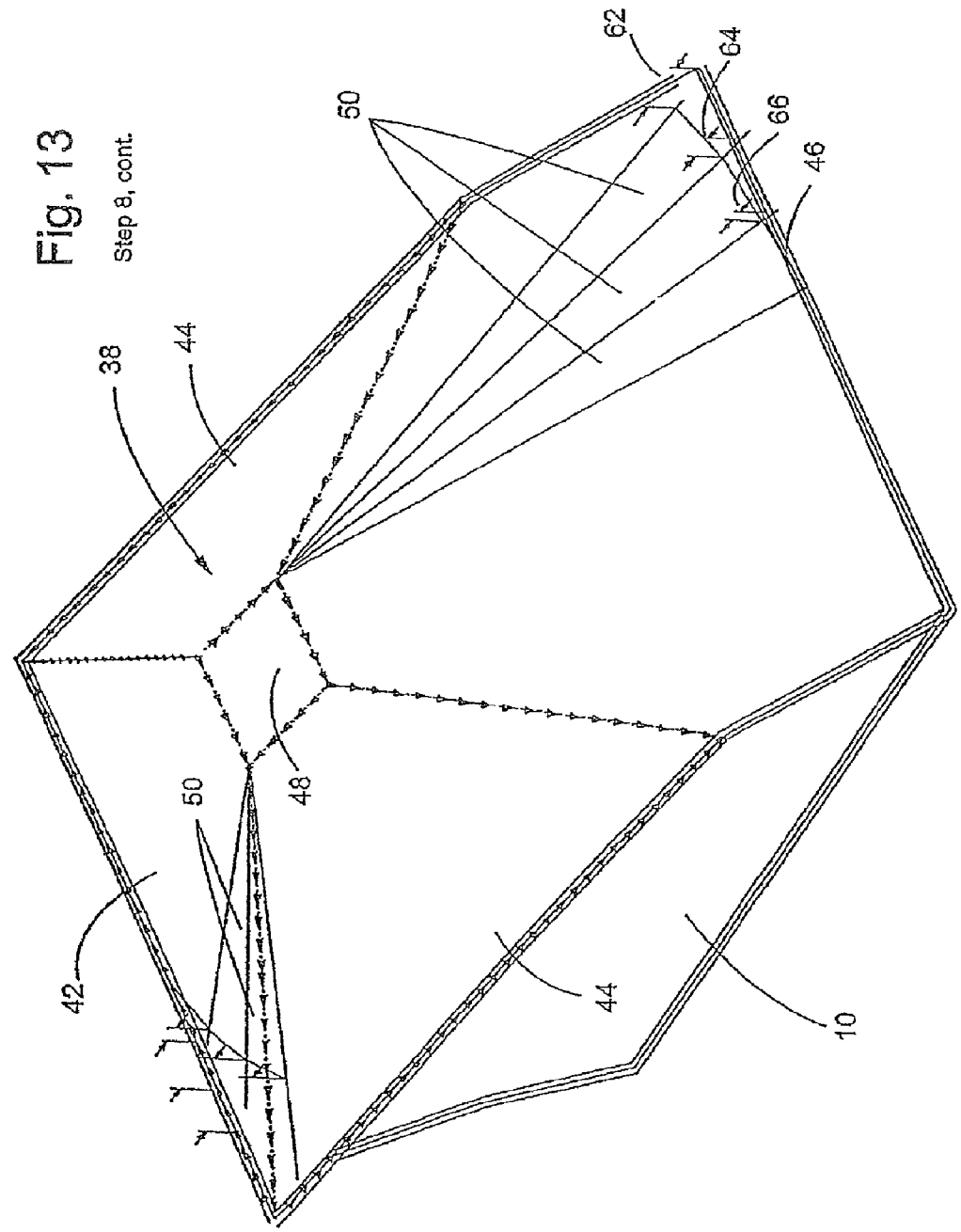

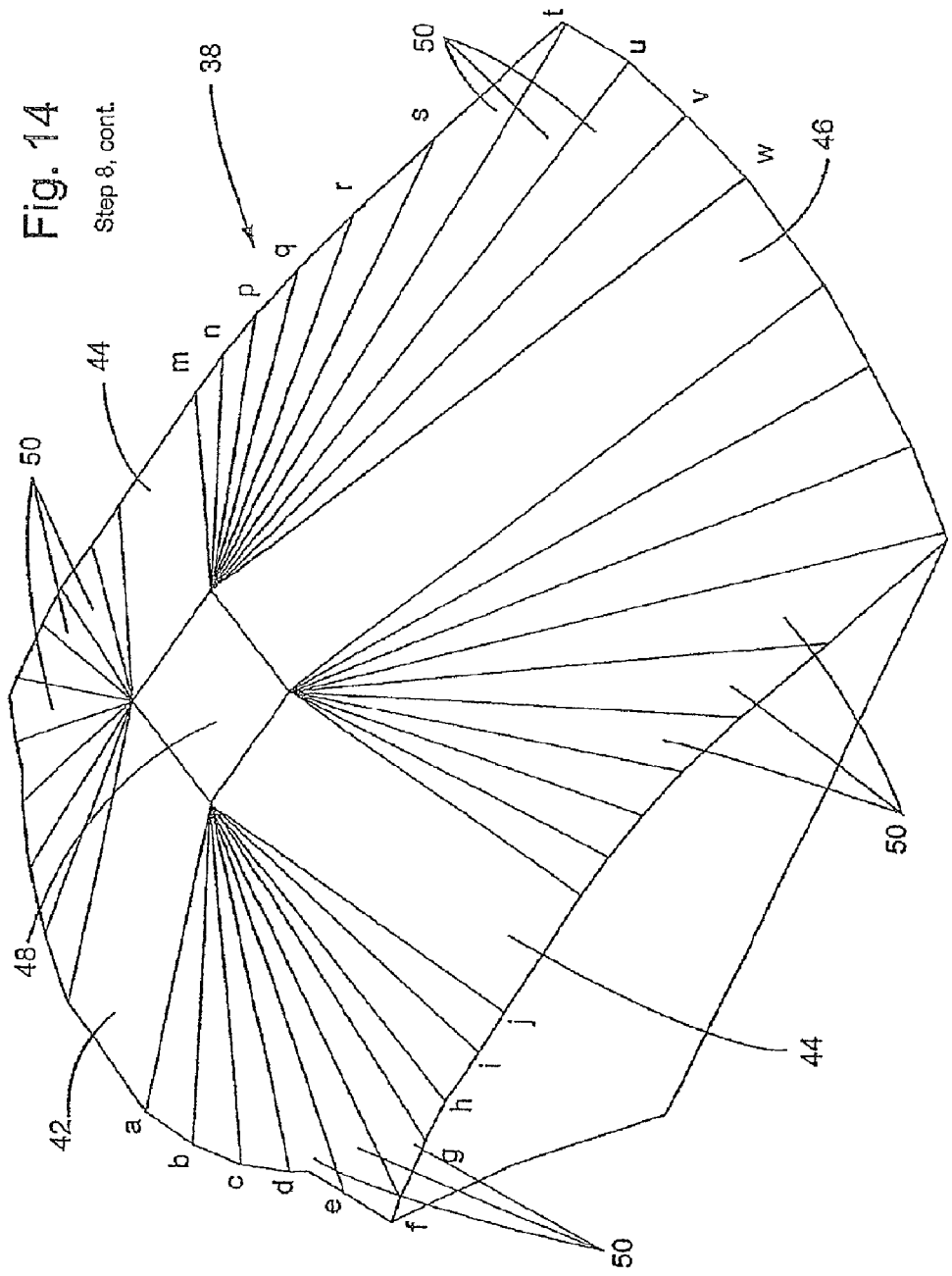

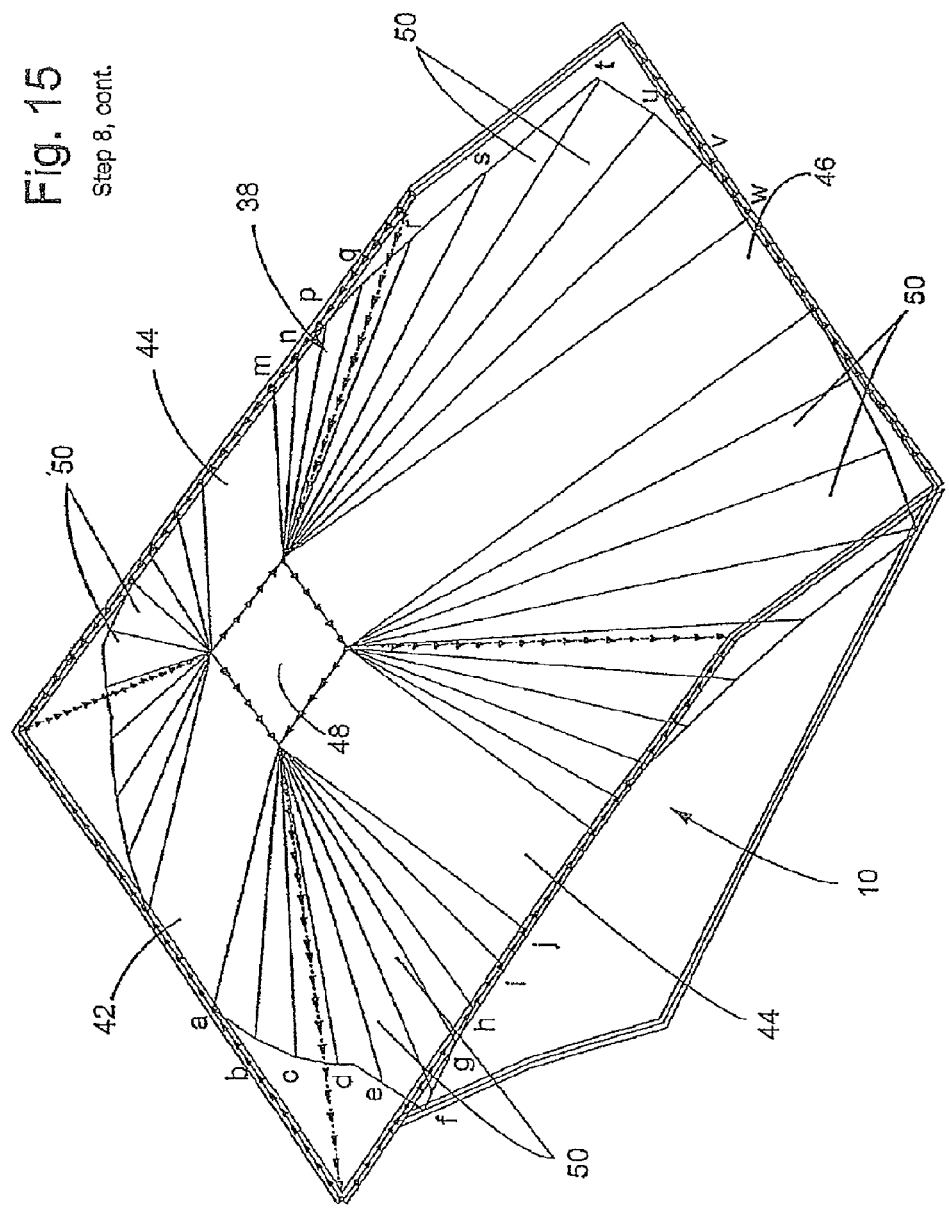

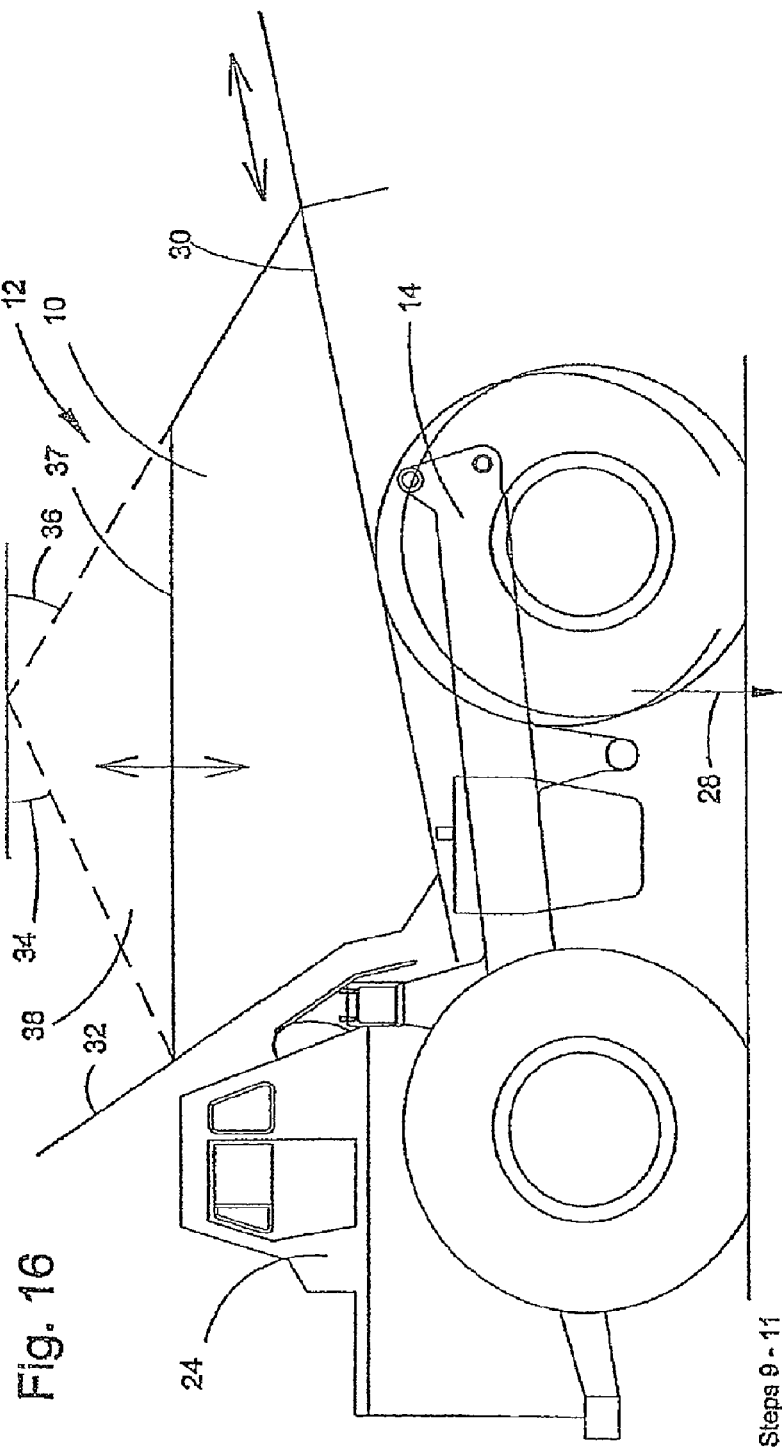

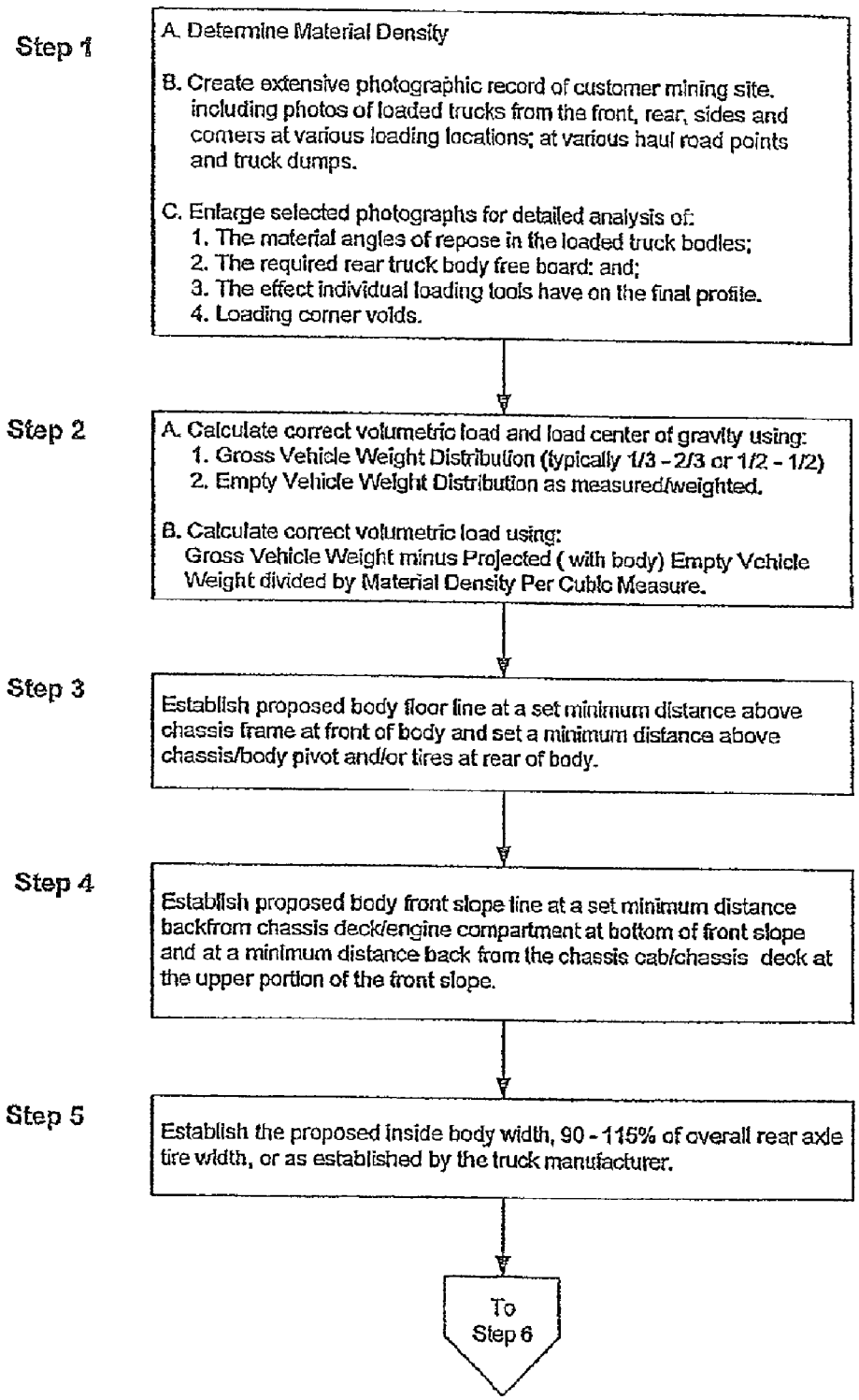

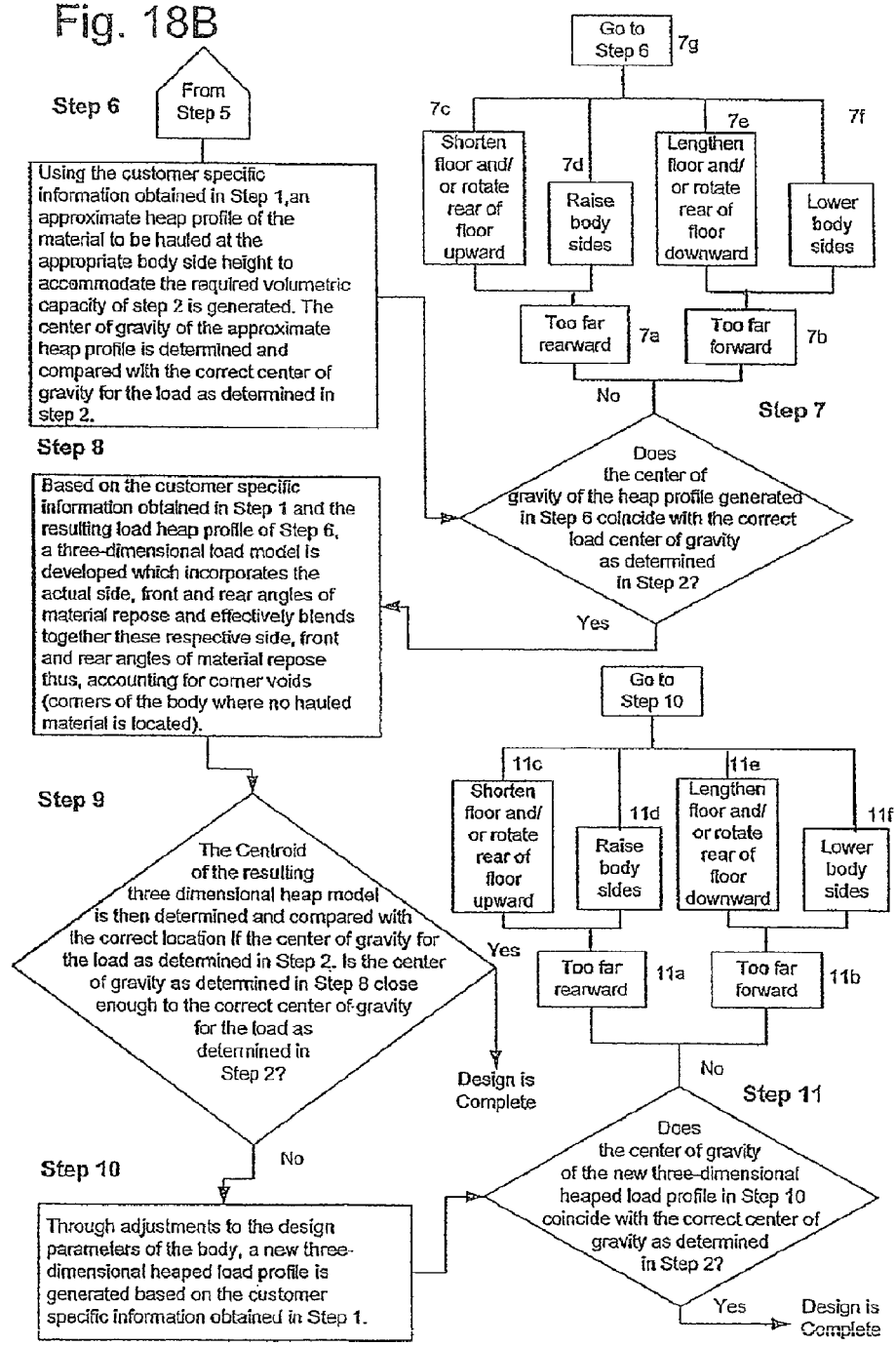

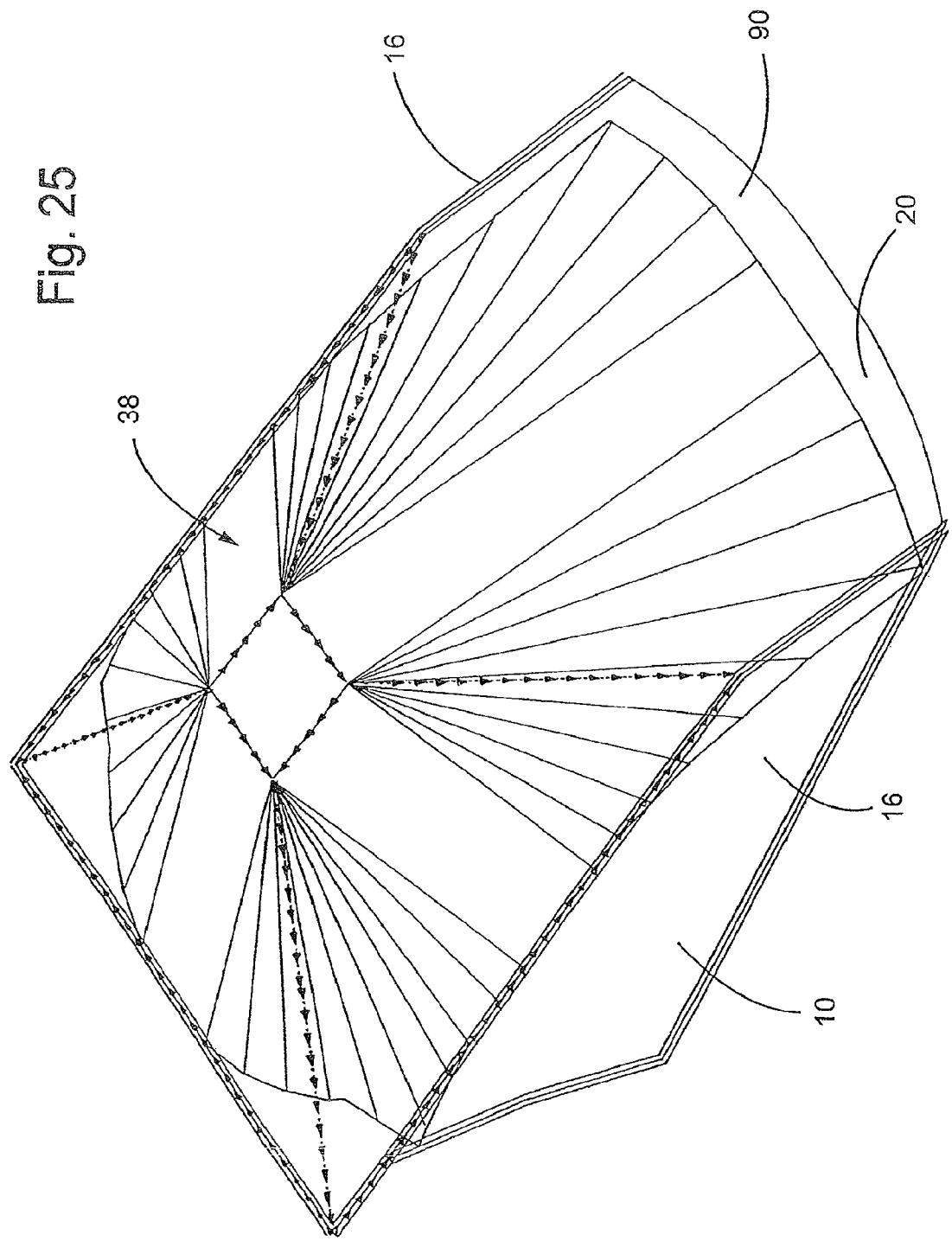

PROCESS FOR THREE-DIMENSIONAL MODELING AND DESIGN OF OFF-HIGHWAY DUMP BODIES

CROSS-REFERENCE TO RELATED APPLICATIONS

This application is a continuation of U.S. Ser. No. 09/593,647 filed Jun. 13, 2000 (Now U.S. Pat. No. 7,369,978), which is a continuation-in-part of U.S. Ser. No. 09/333,379 filed Jun. 15, 1999, (Now U.S. Pat. No. 7,412,357).

FIELD OF THE INVENTION

The present invention relates generally to heavy-duty off-highway trucks, and more particularly to a process for designing an off-highway truck dump body.

BACKGROUND OF THE INVENTION

In mining and construction environments, heavy-duty off-highway trucks are used to haul a variety of materials such as, for example, coal, rock, ore, and overburden materials. Such heavy-duty off-highway trucks generally comprise a truck chassis or frame which supports a dump body for receiving and carrying a load. In order to ensure that the dump body is properly balanced, the dump body should be designed based on an anticipated load distribution of the material carried on the truck chassis or frame. More specifically, the truck chassis anticipates a particular optimal location on the chassis where the center of gravity of the load carried in the dump body should be positioned.

Trucks with dump bodies which are often sold by the original equipment manufacturers have dump bodies designed around an assumed load configuration or load profile. In designing these dump bodies, however, the load profile which is used to size the body is based on a theoretical material angle of repose or load heap of the material irrespective of material cohesiveness, individual material heaping characteristics or material gradation. For example, in designing a dump body for hauling coal one theoretical material heap which is often used is a 3:1 heap (corresponding to an angle of repose of approximately 18°). With bodies designed to haul overburden, a theoretical material heap of 2:1 (or a different S.A.E. 2:1 heap) is often assumed.

Historically, off-highway truck manufacturers have been unable to reach a consensus with regards to the theoretical load heaps or configurations, let alone any consensus on the individual hauled material characteristics that should be used to design the dump bodies. As evidenced by their commercially available literature, some off-highway truck manufacturers use theoretical material heap profiles based on standards promulgated by the Society of Automotive Engineers (S.A.E. J 1363 January 1985) while others use their own heap profiles. Moreover, many off-highway truck manufacturers have over time alternated between using various different theoretical load heap profiles or configurations to design their dump bodies.

Off-highway truck manufacturers use these theoretical load heap profiles so that they are able to mass produce their dump bodies. However, the theoretical load heap, and the resulting theoretical load profiles, which the truck manufacturers use to design their dump bodies ignore a number of factors. For example, theoretical load profiles do not take into account the particular material characteristics of the material being loaded and hauled. In addition, theoretical load profiles do not take into account the corner voids which occur when a load is placed in the dump body. In particular, since the material is loaded from overhead into the dump body, the material tends to try to form a generally conical shape in the dump body. Because the load conforms to a generally conical shape, voids are created in the corners of the dump body where no material is present. The theoretical load profiles as used by truck manufacturers ignore these corner voids.

Additionally, field loading/haulage conditions impact the actual angles of repose that the loaded material forms in the dump body. In the loading process, material on its own flows to a natural angle of repose, however, in the loading process as the loading equipment pushes/pulls and rests on the material being loaded an imposed material angle of repose results. For instance, the method by which the material is actually loaded into the dump body, e.g. using a front-end loader or a shovel, can impact the ultimate actual profile of the load in the body. Other material characteristics such as the cohesiveness, gradation, size and consistency of the material (e.g., ore, overburden, clay, etc.) also impacts the actual load profile. Accordingly, because of differences in the materials and field loading and haulage conditions, the actual load profile or configuration of given materials in the dump body at different sites can vary extensively.

As a result, the mass-produced dump bodies supplied by off-highway truck manufacturers which are based on a theoretical material load profile are often improperly matched for a particular material haulage application. For example, the dump body may be inadvertently designed such that the dump body size and resultant load is either undersized/underloaded or oversized/overloaded and that the corresponding center of gravity of the actual load is significantly offset from where it should be placed, based on the design of the truck chassis. This causes incorrect truck loading and improper truck utilization with uneven loading of the truck chassis leading to uneven or offset frame loading, which can potentially result in truck chassis problems including uneven tire wear which often requires premature replacement of the tires; and potentially poor vehicle operating stability. As will be appreciated, since the trucks themselves and the tires used on these types of off-highway trucks are extremely costly, potential truck chassis repair and premature replacement of tires significantly increases the operating expenses associated with material haulage.

Likewise, depending on how the actual material and material heap varies from a theoretical material load profile, the dump body can be either too large or too small resulting in the truck chassis carrying loads which are both improperly placed on the truck frame and significantly heavier or lighter than intended. An improperly designed body which is too small to carry the intended load can lead to spillage of the load over the sides and off the rear end of the body resulting in significant under utilization of the truck. If side/rear spillage occurs during transport, it can result in tire damage and tire ruptures particularly on the following trucks. While too large of a body for the intended load can result in extreme truck overloads or if the load is limited to the correct load amount in the dump body, the load may often be improperly placed in the dump body leading to poor truck stability and individual truck chassis component overloads.

OBJECTS AND SUMMARY OF THE INVENTION

Accordingly, in view of the foregoing, a general object of the invention is to provide a dump body which is designed for specific field operating environments.

A related object is to provide a method for designing off-highway dump bodies which more accurately takes into account actual field conditions.

A more specific object is to provide a process for three-dimensional modeling of required dump body loads and the related design of dump bodies based on actual field conditions at particular sites.

These and other features and advantages of the invention will be more readily apparent upon reading the following description of a preferred exemplary embodiment of the invention and upon reference to the accompanying drawings wherein:

BRIEF DESCRIPTION OF THE DRAWINGS

FIG. 9 is top view of the dump body and material heap of FIGS. 8A and 8B illustrating in part how the corners of the heaped load are modeled based on an incremental blending of the side angles of material repose to the front and rear angles of material repose to develop the three-dimensional modeled material heap profile.

FIGS. 10a and 10b are top views of the dump body and material heap of FIGS. 8A and 8B illustrating in part how the corners of the heaped load are modeled based on an incremental blending of the side angles of material repose to the front and rear angles of material repose to develop the three-dimensional modeled material heap profile.

FIGS. 10c and 11 are perspective views of the dump body and material heap of FIGS. 8A and 8B illustrating in part how the corners of the heaped load are modeled based on an incremental blending of the side angles of material repose to the front and rear angles of material repose to develop the three-dimensional modeled material heap profile.

FIG. 12 is a side view of the dump body and material heap of FIGS. 8A and 8B illustrating in part how the corners of the heaped load are modeled based on an incremental blending of the side angles of material repose to the front and rear angles of material repose to develop the three-dimensional modeled material heap profile.

FIG. 13 is a perspective view of the dump body and material heap of FIG. 8A and 8B illustrating how the corners of the heaped load are modeled based on an incremental blending of the side angles of material repose to the front and rear angles of material repose to develop the three-dimensional modeled material heap profile.

FIG. 14 is a perspective view of the final three-dimensional modeled material heap profile for use in the dump body design process of the present invention.

FIG. 15 is a perspective view of the three-dimensional modeled material heap profile of FIG. 14 in the dump body of FIGS. 8A and 8B.

FIG. 16 is a side view of the off-highway truck of FIGS. 1-7 having the dump body and material heap profile of FIG. 15 illustrating a further step in the dump body design process of the present invention.

FIGS. 18a-b are a flow diagram of an exemplary embodiment of the design process of the present invention.

FIG. 25 is a perspective view of an alternative embodiment of dump body according to the present invention have a curved rear edge.

While the invention will be described and disclosed in connection with certain preferred embodiments and procedures, it is not intended to limit the invention to those specific embodiments. Rather it is intended to cover all such alternative embodiments and modifications as fall within the spirit and scope of the invention.

DETAILED DESCRIPTION OF THE PREFERRED EMBODIMENT

Figure 17:
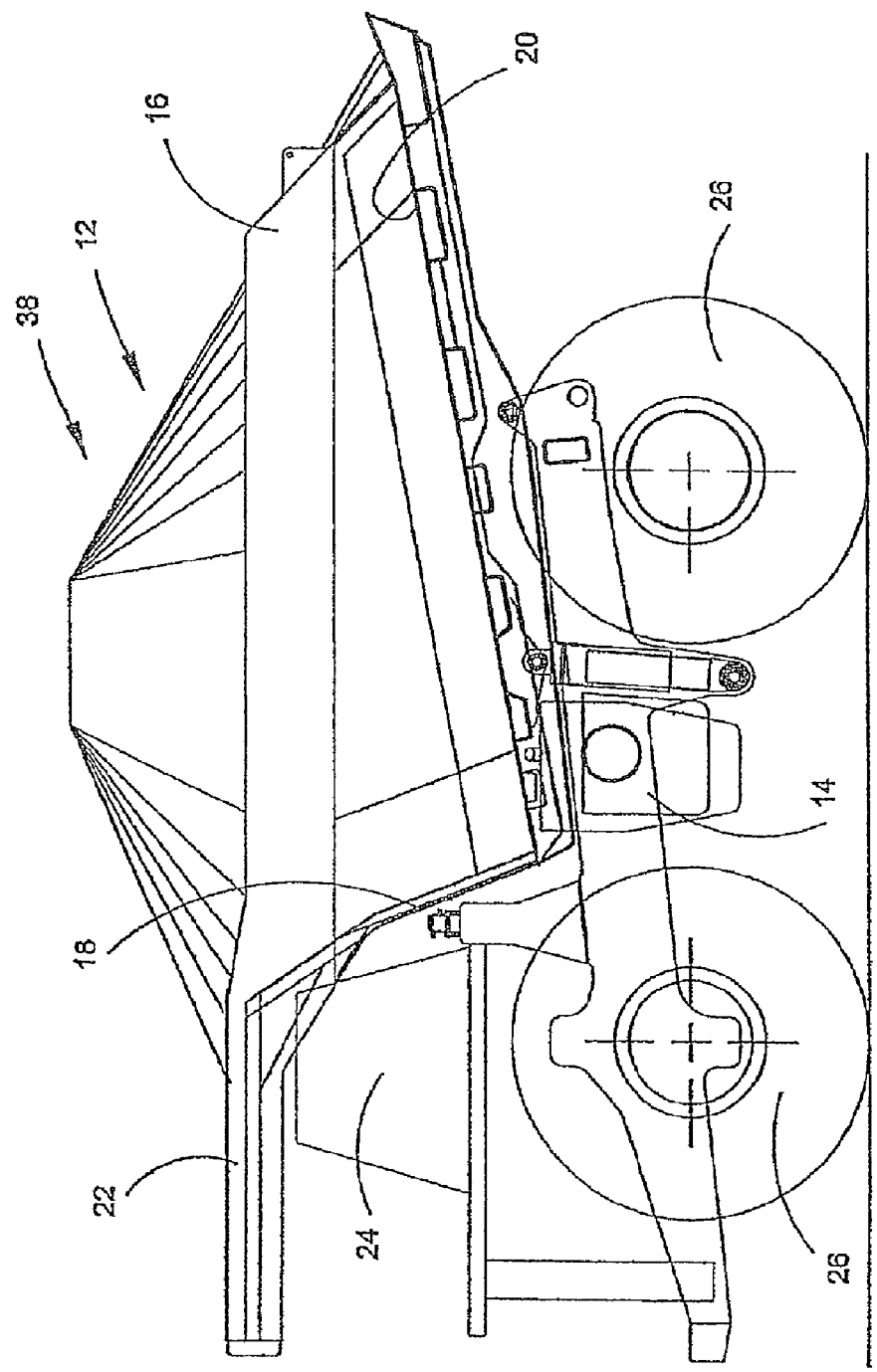
FIG. 17 is a side view illustrating the final design of the dump body.

Referring now more particularly to the drawings there is shown in FIGS. 1-17 an illustrative sequence of process steps for designing a dump body 10 for an heavy-duty off-highway truck 12 in accordance with the teachings of the present invention. The truck 12 includes a chassis 14 to which the dump body 10 is attached for pivotal movement about an axis between a lowered position for receiving and transporting a load of material and a raised position for dumping a load of material. As shown in FIG. 17, the dump body 10 is generally constructed of steel panels which define the shape of the dump body and beams which form the structural framework for the dump body. The dump body comprises, in this case, sidewalls 16, a front wall or front slope 18, a floor 20 and a canopy 22 integrally connected to the top end of the front slope 18 and extending over the cab 24 of the truck 12. The truck chassis 14 is supported by a plurality of tires 26.

In the illustrated embodiment, the truck 12 is generally symmetrical about its longitudinal axis. Accordingly, as will be appreciated, many of the elements identified in the side views of FIGS. 1-7 have complementary elements arranged on the opposite side of the truck 12. As will be appreciated, reference to plural elements where only one is shown indicate that a complementary element is disposed on the side of the truck 12 not shown (e.g., sidewalls 16).

In accordance with an important aspect of the present invention, the dump body 10 is designed so that the volumetric capacity of the dump body matches the truck hauling capacity and that loads in the dump body have a center of gravity that best matches the intended load center of gravity/corresponding load distribution contemplated by the design of the truck chassis 14. More specifically, the dump body 10 is shaped and dimensioned to accommodate the correct volumetric load as well as to maintain a load distribution that results in the center of gravity of the load being proximate a predetermined location, in this case, the preferred position for the load center of gravity based on the truck manufacturer's designed chassis loading/weight distribution. Unlike previous dump body design methods, the dump body design of the present invention is not based on an assumed theoretical or universal load profile/load material heap. Instead, the present invention utilizes a load profile that is based on a detailed analysis of the actual material characteristics and loading conditions present in specific field haulage environments thereby taking into account factors such as the cohesiveness of the material to be hauled and the size, shape and gradation of the pieces of material.

For example, U.S. Pat. No. 5,887,914 issued to LeRoy G. Hagenbuch on Mar. 30, 1999 discloses a dump body design process which can be used to produce a dump body that is capable of hauling both overburden and coal. This design process assumes a theoretical 2:1 heap for overburden and a theoretical 3:1 heap for coal. It has been found that these theoretical load profile assumptions do not always provide an accurate body design of the actual haulage operating conditions which are encountered at specific job sites. Such theoretical body load profiles, are used without any consideration of the actual material, loading and hauling conditions that exist at actual locations of use. Thus, in many cases the dump body can be improperly sized and designed or matched to the material to be hauled and accordingly to the truck chassis.

Figure 21:
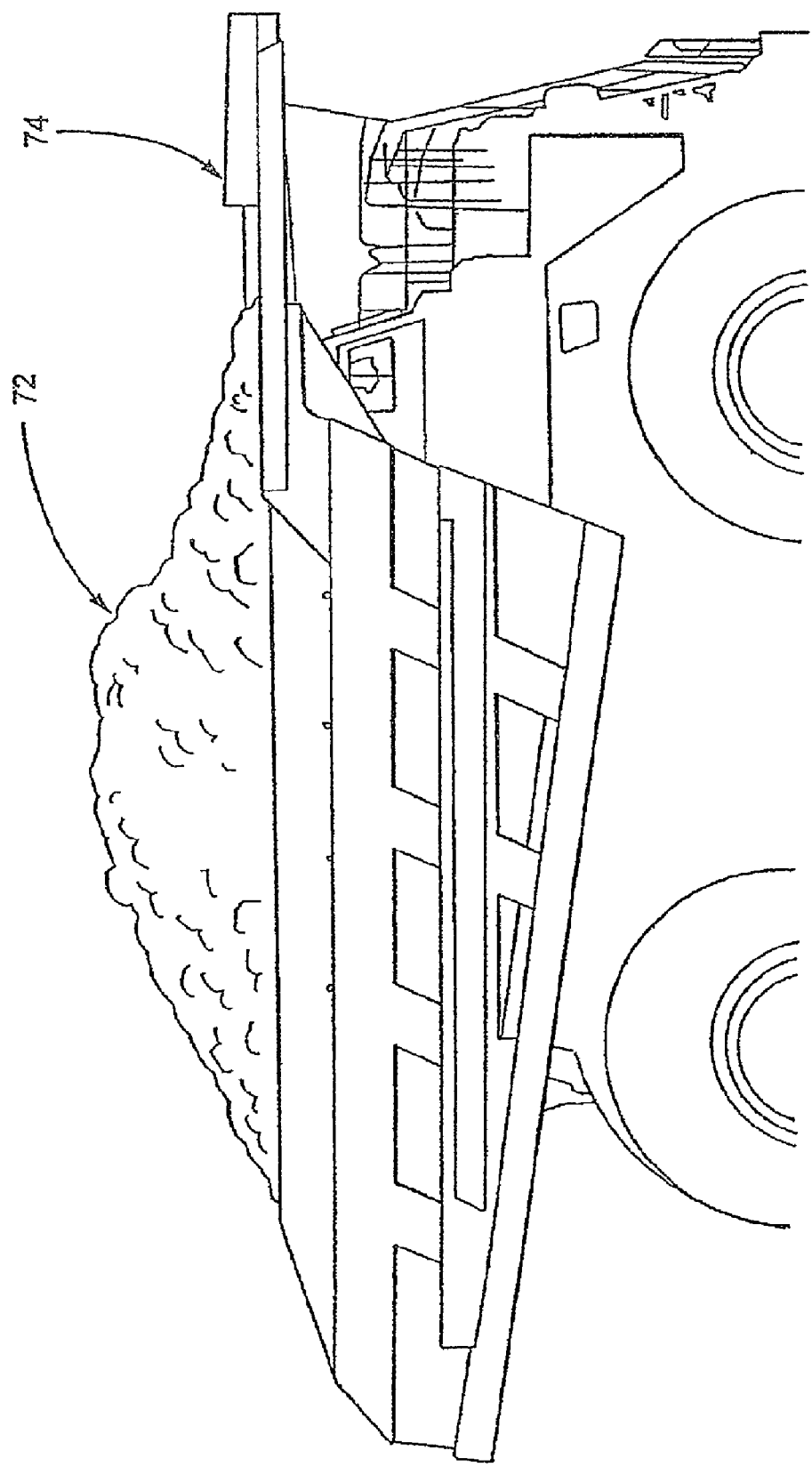
FIG. 21 is a side view of an off-highway truck carrying a load in an exemplary field operating environment.
Figure 22:
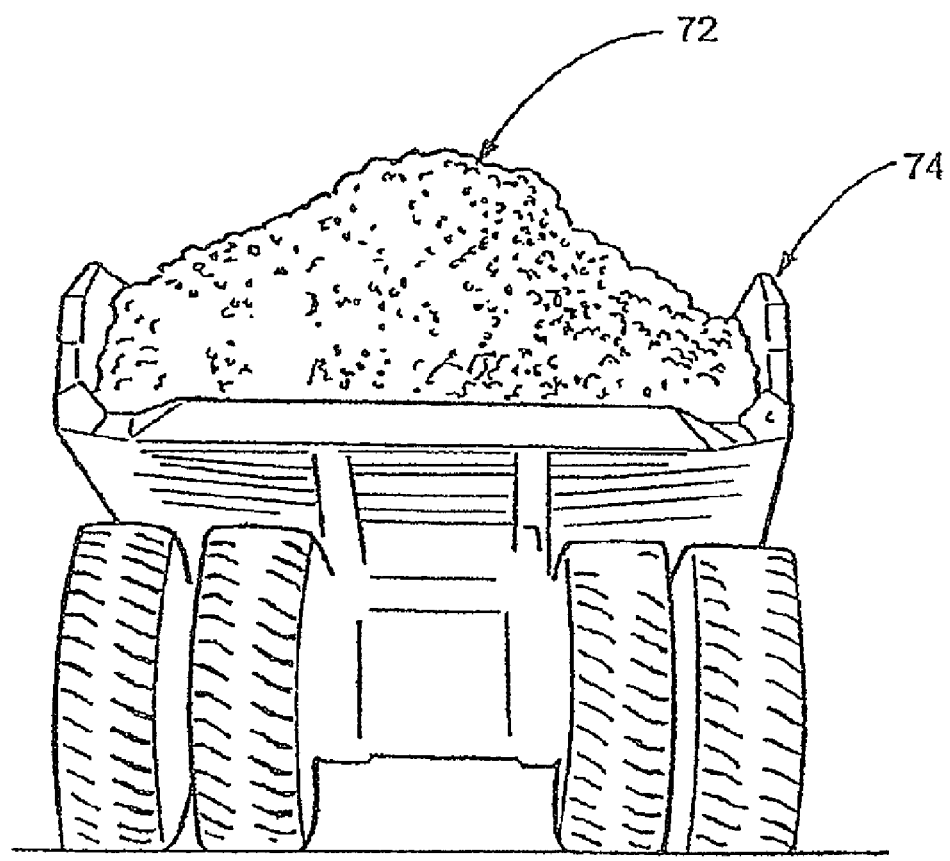
FIG. 22 is an end view of an off-highway truck carrying a load in an exemplary field operating environment.

In order to more accurately take into account actual field conditions, the first step in the design process of the present invention is to collect field data relating to the material characteristics and load configurations currently being hauled by trucks at the site at which the dump body 10 will be used. In particular, data should be collected with regard to the actual angles of material repose, the size and shape of any plateau formed at the top of the load and loading voids that are formed by the material when it is loaded and carried in existing dump bodies. The angles of material repose are dependent upon a number of factors including the cohesiveness of the material being hauled and the size, shape and gradation of the material pieces. With respect to analyzing the angles of repose, load plateau and loading voids of the loaded material, one method by which this can be accomplished is to photograph (or videotape) from various different angles the loads 72 presently being hauled by one or more existing off-highway trucks 74 at a site (see, e.g., FIGS. 21 and 22). More specifically, photographs should be taken of loads 72 carried by several different existing trucks 74 with photographs being taken from the front, back, corners (front and rear) and sides of those trucks. In order to help identify any shifting of the load that may effect load profiles and which may occur during transport, photographs can be taken of the loaded trucks as they are leaving the loading area as well as when they are traveling on the haul roads.

Furthermore, since the method by which material is loaded into the truck 12 can also impact the loaded material profile, it can also be useful to collect data, via photographs or otherwise, regarding truck loading techniques and the equipment used to load the dump bodies. For example, front-end loaders generally have a wide bucket relative to the dump body length and typically load material into the dump body from the side of the truck. Accordingly, when front end-loaders will be used to load the dump body, the length of the dump body can be an important factor. Likewise, cable and hydraulic shovels tend to have narrower buckets and are also used to load material into the body typically from the side of the truck. Since cable shovels typically have a door which swings toward the shovel when dumping (i.e. towards the side of the body), the width of the body may be an important factor when shovels will be used to load the dump body. Additionally, information should be collected giving an accurate material density. The types of information which can be relevant to determining the density of the load material include visual examinations of the load material, the taking of weight samples of known volumes of the load material and consultations with the end user of the proposed dump body.

In some circumstances, such as in the case of a new mine, it may not be possible or desirable to collect material and loading data from the site at which the dump body 10 will be used. In these situations, data from a similar field haulage environment should be used. As will be appreciated by those skilled in the art, a similar field haulage environment would have conditions that parallel as closely as possible the conditions which are anticipated at the new site. This could include, for example, a nearby site or mine in which the same or similar material is hauled, a site hauling similar materials and using similar hauling equipment and/or a site using similar loading equipment. Once the new mine or site is operational, the design of future dump bodies for that site can be refined as needed and as information is developed about the material and loading conditions at the site. Of course, the material and loading conditions at sites will, in most cases, evolve over time which could necessitate further analysis of these parameters prior to the design of new additional dump bodies for that site.

Once the appropriate load heap pictorial information has been collected, the information is then analyzed to determine what are the actual angles of material repose of the loaded material and the dimensions of the top plateau of the material heap. In one presently preferred embodiment, this is accomplished by blowing up at least select representative photographs of off-highway trucks with loaded material. From these blown up photographs, the size of the plateau of the heap, the angles of material repose and the corner voids of the loaded materials are then measured. In most cases, the angles of material repose that run to the front, rear and sides of the dump body will all be somewhat different namely due to the natural and imposed angles of repose occurring as a result of the loading process. Accordingly, using the photographs, values should be determined for each of these angles repose. The various values for the front, rear and side angles of repose which are measured from the photographs are compiled and averaged respectively in order to produce a composite front angle of repose, a composite rear angle of repose and a composite side angle of repose which can then be used to create a three-dimensional load profile as described in greater detail below. Of course, as will be appreciated by those skilled in the art, other methods may be used to collect and analyze the data on actual dump body field haulage conditions including, for example, actual hands-on measurements of the relevant angles of repose and corner voids.

Figure 1:
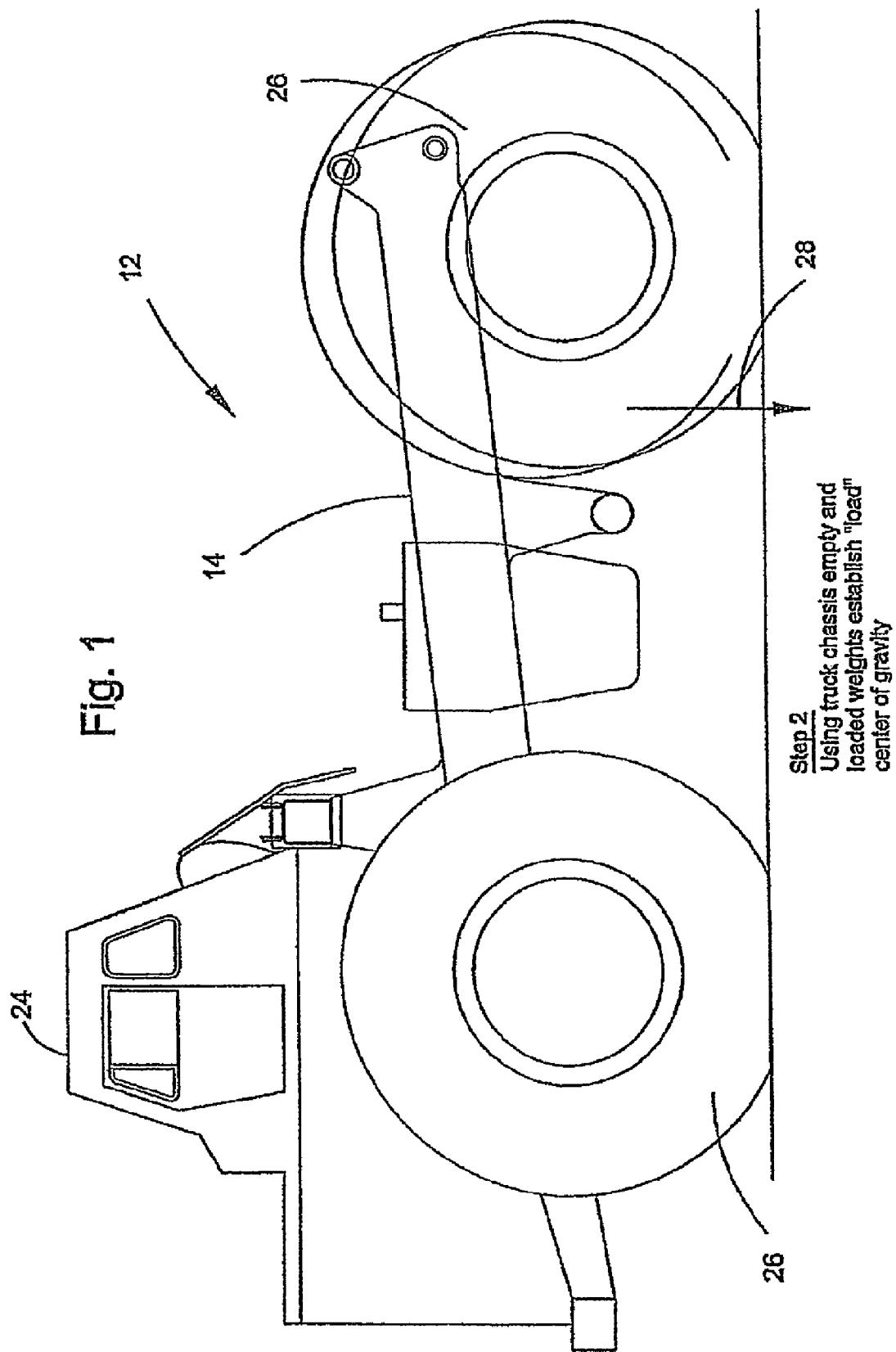
FIGS. 1-7 are side views and a rear view (FIG. 6) of a heavy-duty, off-highway truck illustrating a portion of an exemplary sequence of process steps for designing a dump body for the truck in accordance with the present invention.

Using the values of the empty and loaded weights of the truck 12 provided by the off-highway truck manufacturer, the ideal position along the chassis 14 for the load center of gravity is then determined. As illustrated in FIG. 1, the correct load center of gravity on the chassis 14 (represented by arrow 28 in the drawings) is located using conventional moment diagrams.

Figure 2:
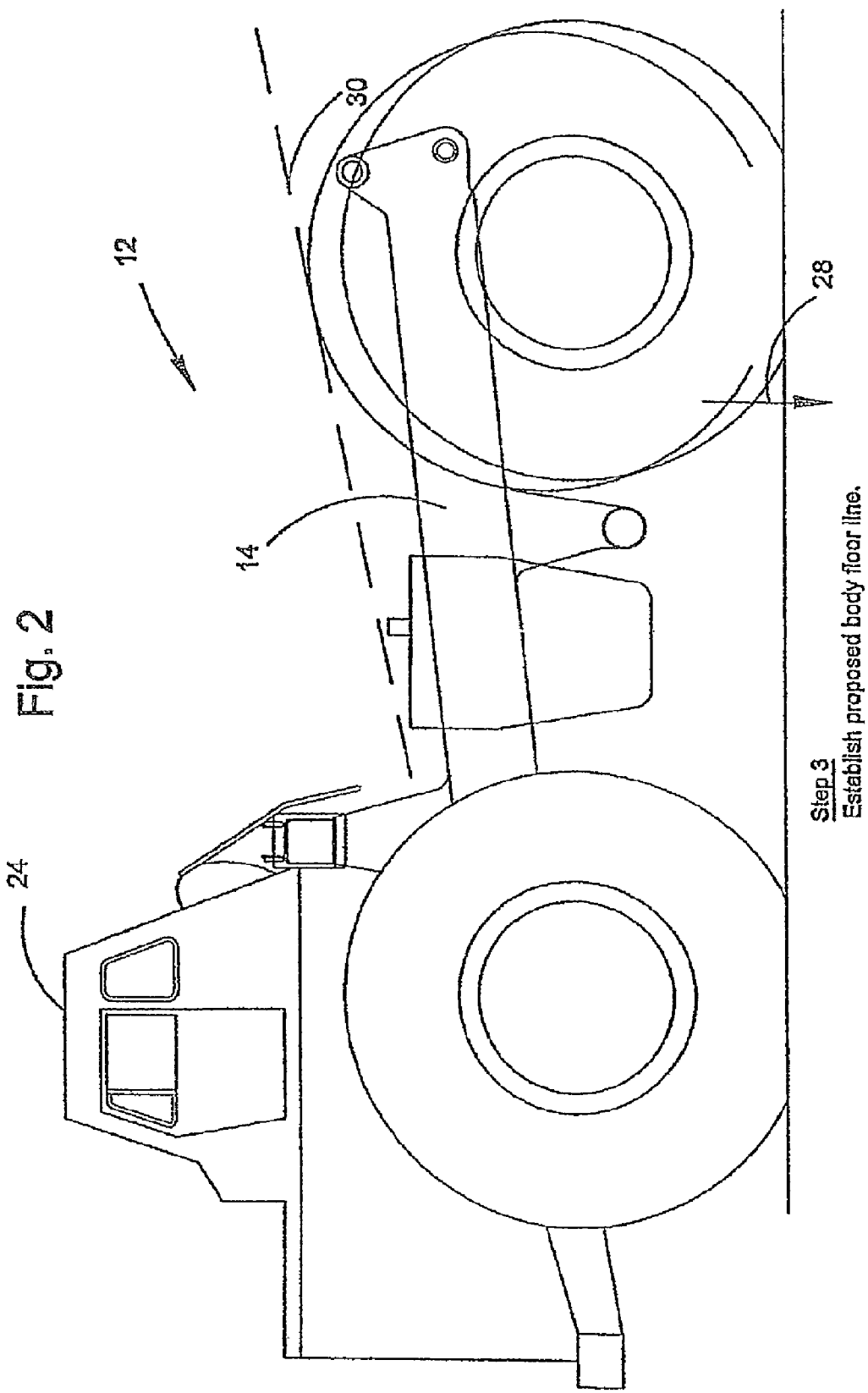
Figure 3:
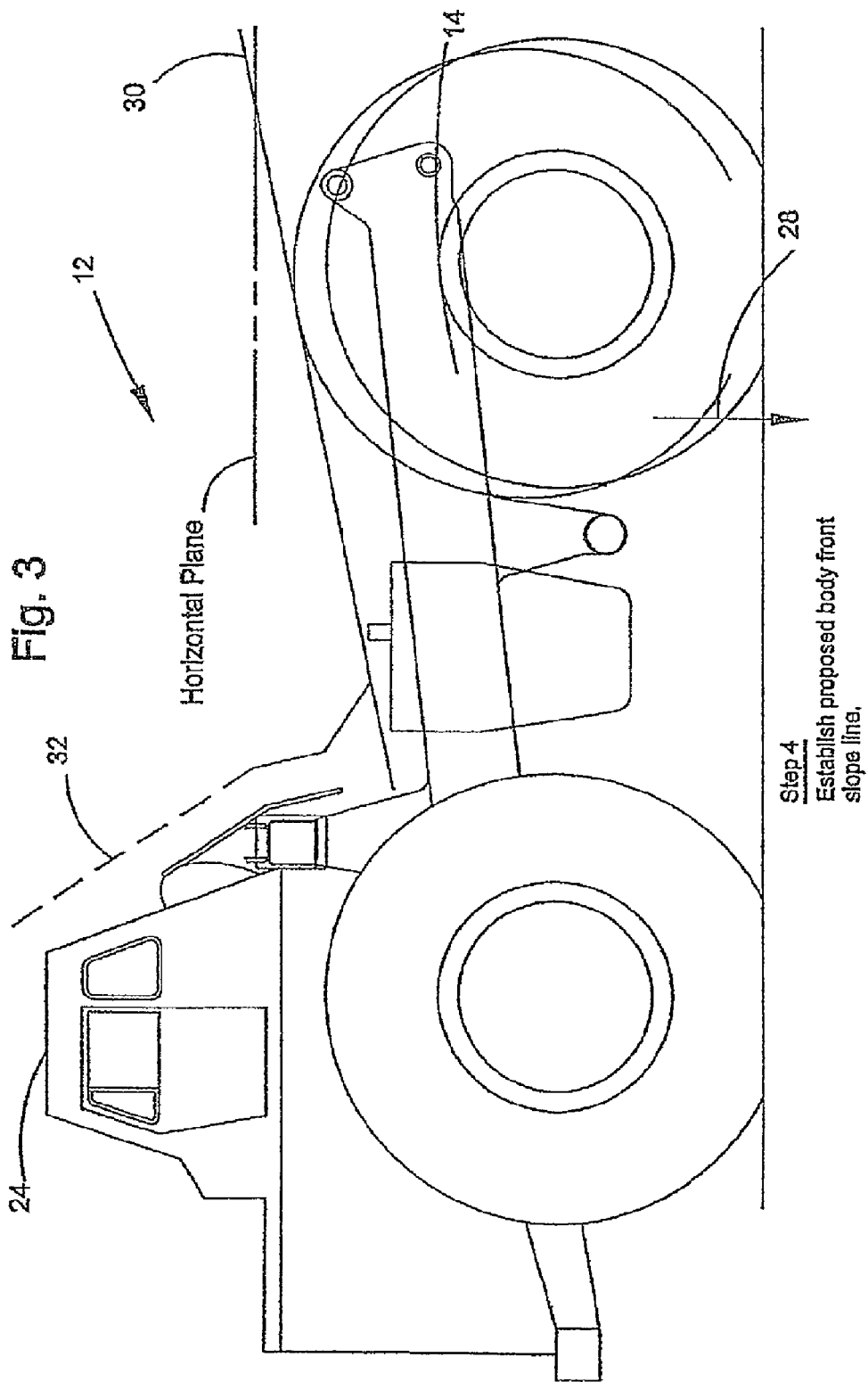
Figure 4:
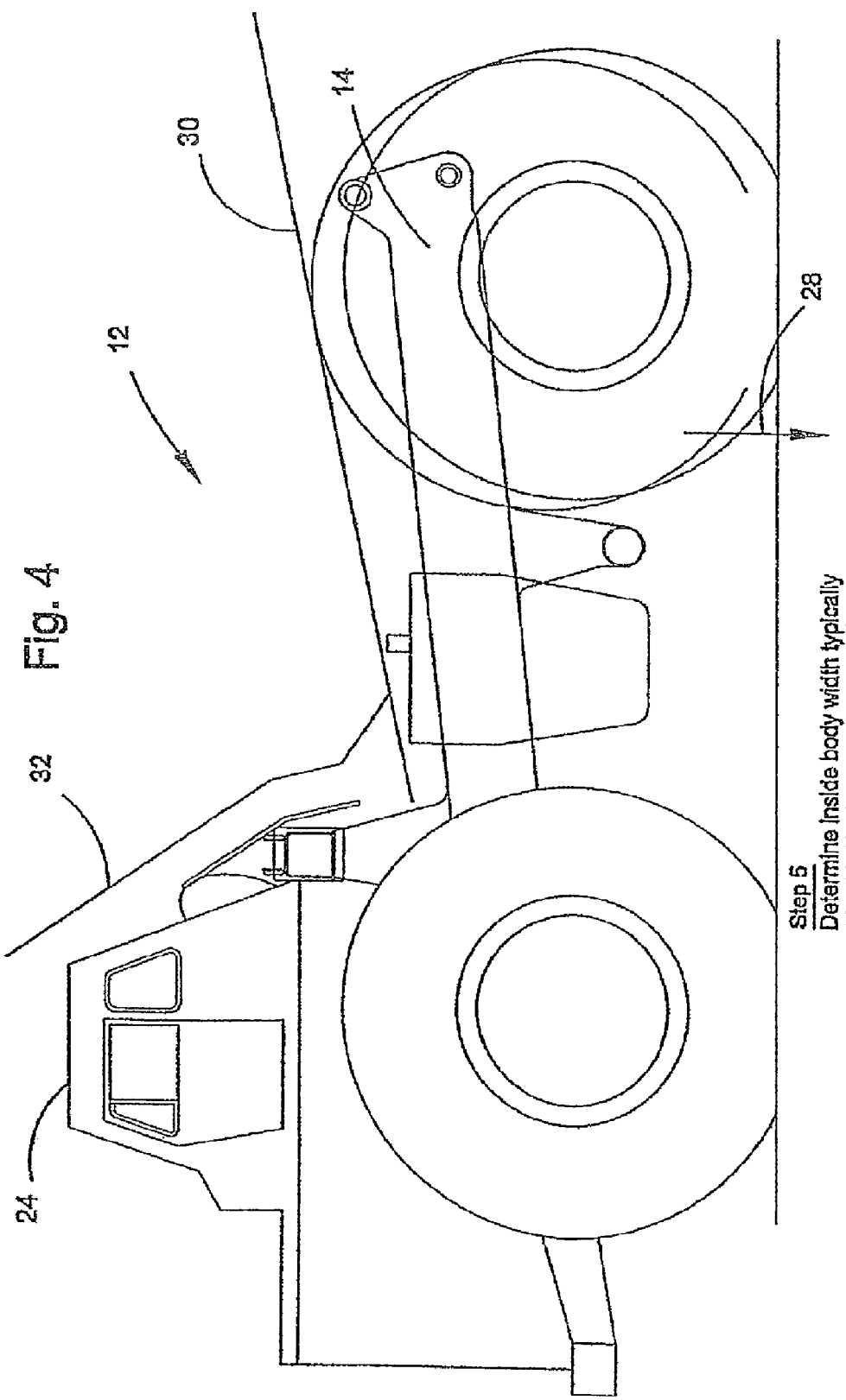

To begin designing the body 10, as shown in FIG. 2, a line 30 is established to represent the plane of the dump body floor. Generally, the angle of the floor line 30 is established to provide an incline with respect to the horizontal plane as illustrated in FIG. 3 and is established at a set minimum distance above the chassis 14 at the front of the body and a set minimum distance above the chassis and/or tires at the rear of the body. A proposed line 32 for the front slope of the dump body is also established, as shown in FIG. 3, at a set minimum distance back from the chassis deck/engine compartment at the bottom end of the front slope and at a set minimum distance back from the chassis cab 24 at the upper portion of the front slope. To minimize the vertical height of the center of gravity of the load, it is preferable to set the initial front slope line 32 as far forward and the initial floor line 30 as low as possible while still maintaining the appropriate clearances for the truck cab 24 and chassis 14. As shown in FIG. 4, the initial proposed inside body width of the body 10 is then set based on 90-115% of the overall rear axle tire width or as set by the truck chassis manufacturer.

Figure 5:
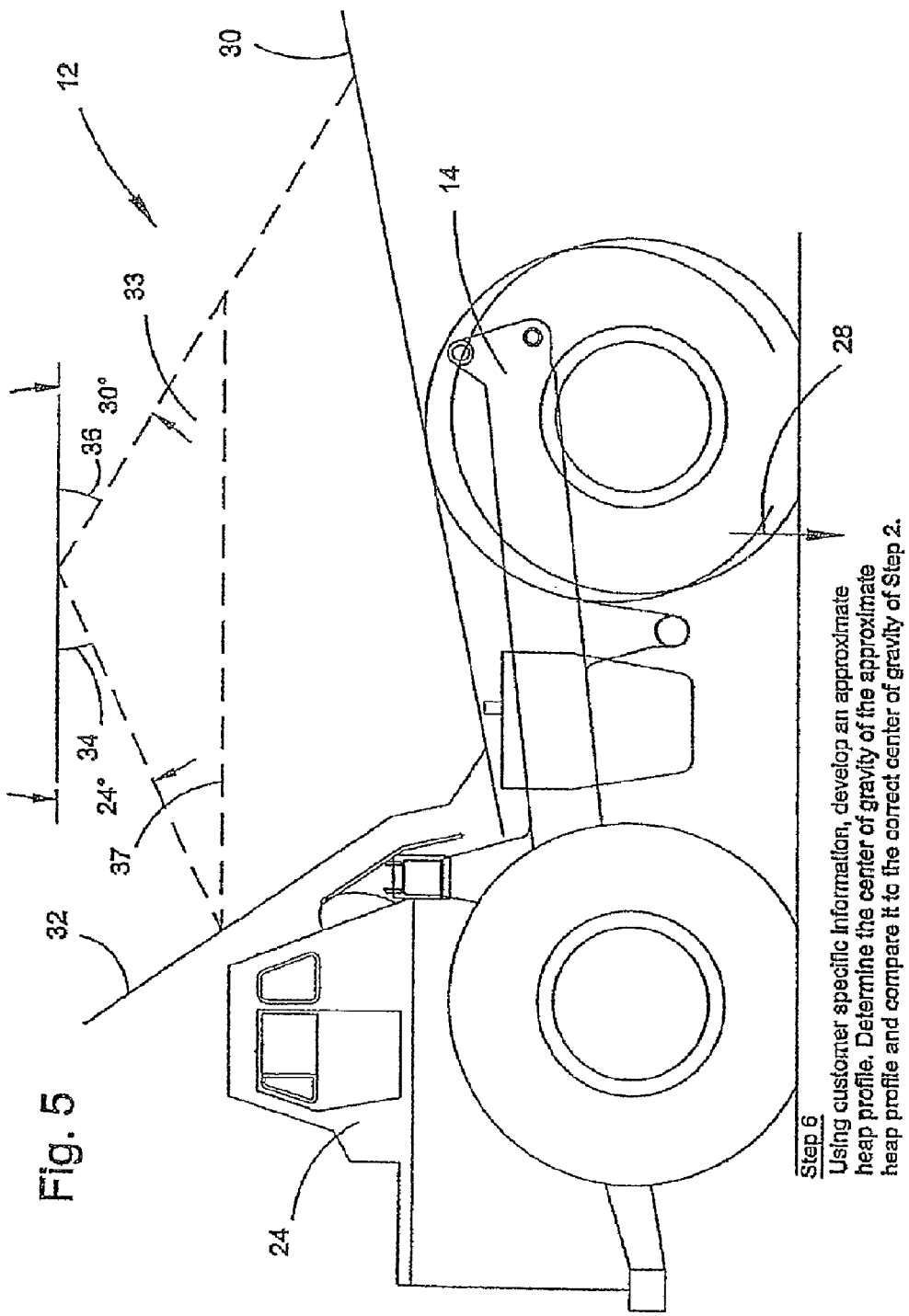
Figure 6:
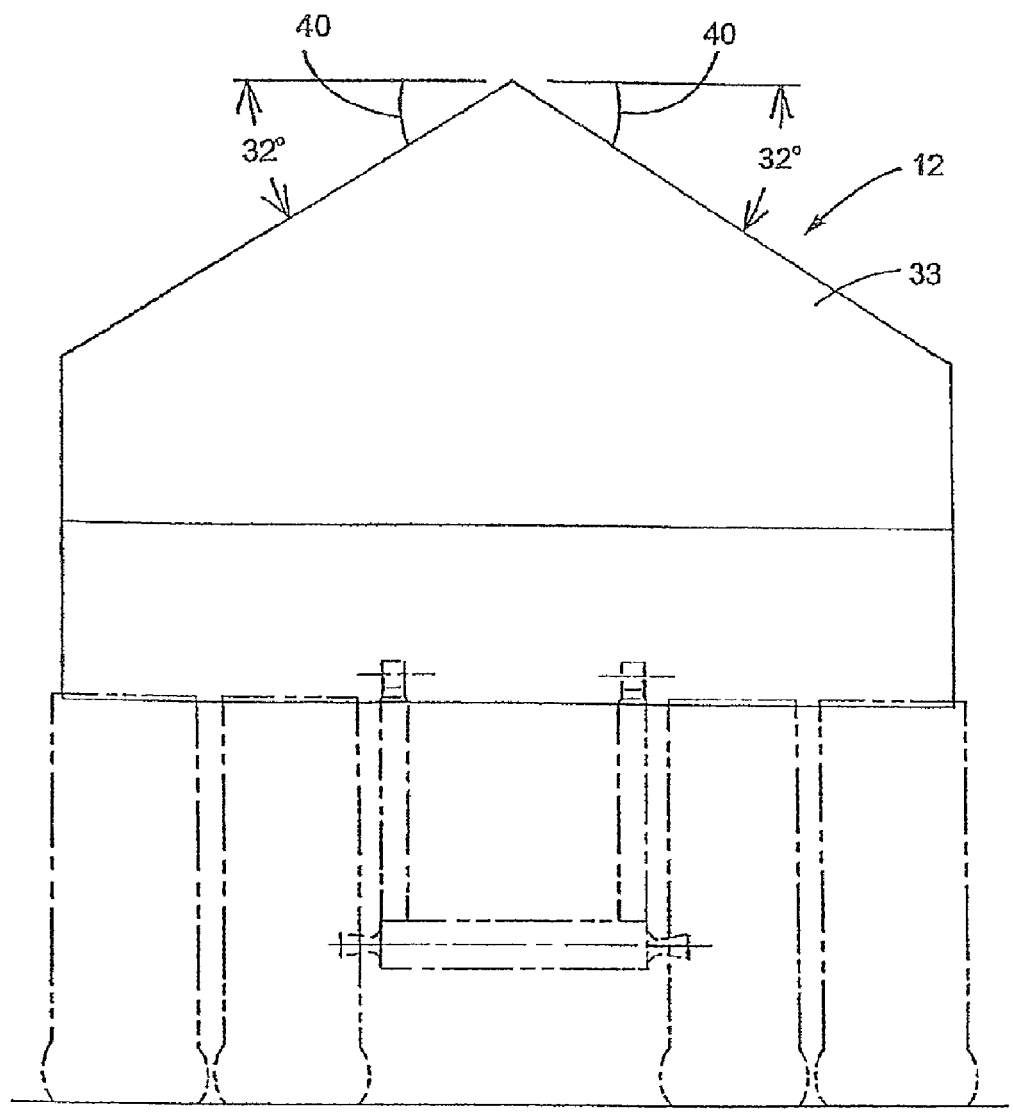

As shown in FIGS. 5 and 6, using the angles of material repose (i.e. front, rear and sides) data obtained from the analysis of the actual field haulage conditions, an approximate heap profile 33 of the material to be hauled is then generated utilizing the individual average values for the front, rear and sides angles of material repose 34, 36, 40 (e.g., 24°, 30° and 32° respectively in the illustrated embodiment) taken from the field data. Additionally, as shown in FIG. 5, an initial dump body side height (referenced as line 37) is established at the point where the front angle of material repose 34 contacts the front slope line 32. The placement of the center of gravity of the approximate heap profile 33 along the truck chassis 14 is then determined and compared with the optimal location along the chassis for the load center of gravity (arrow 28).

Figure 7:
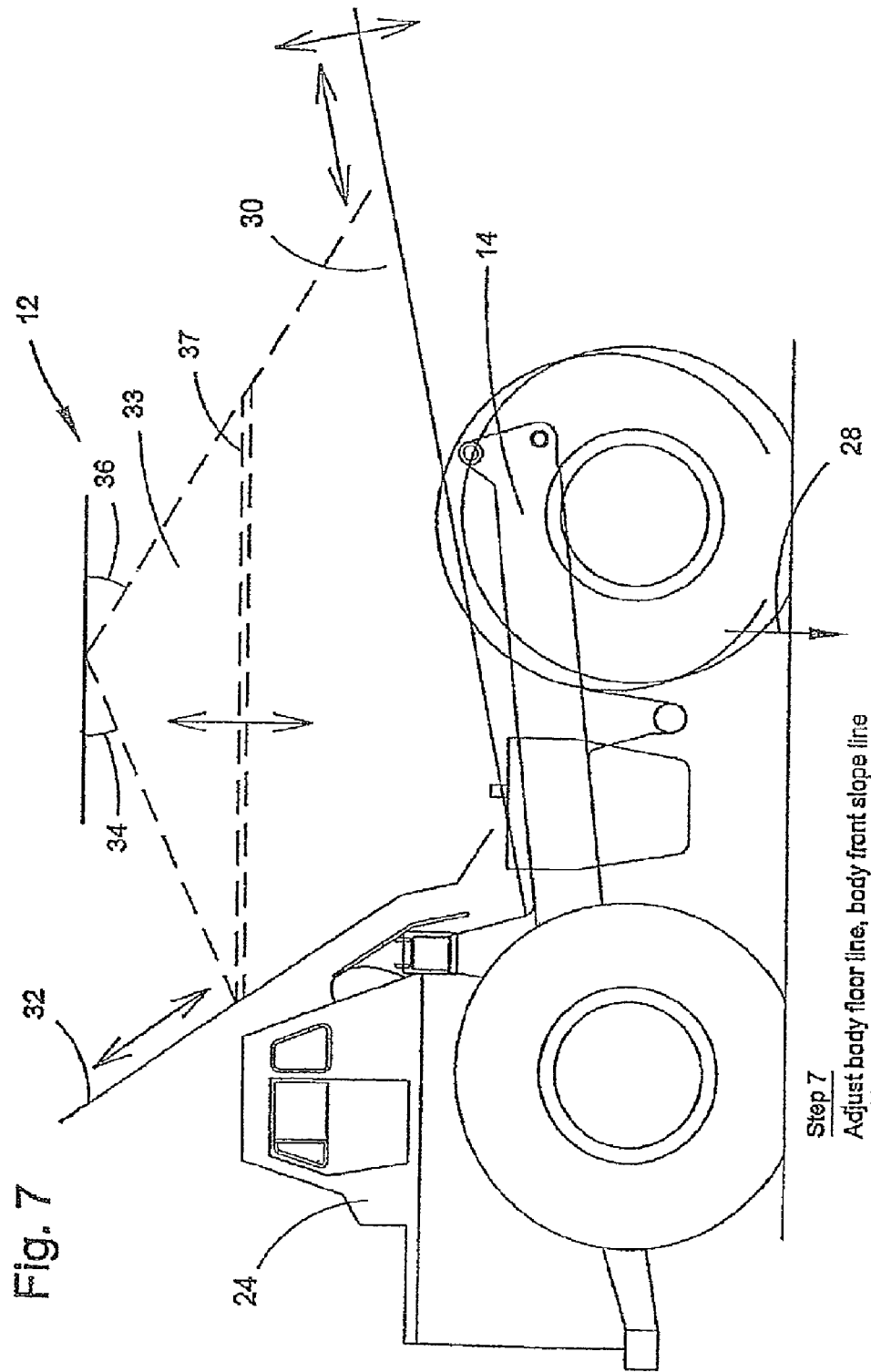
Figures 8A, 8B:
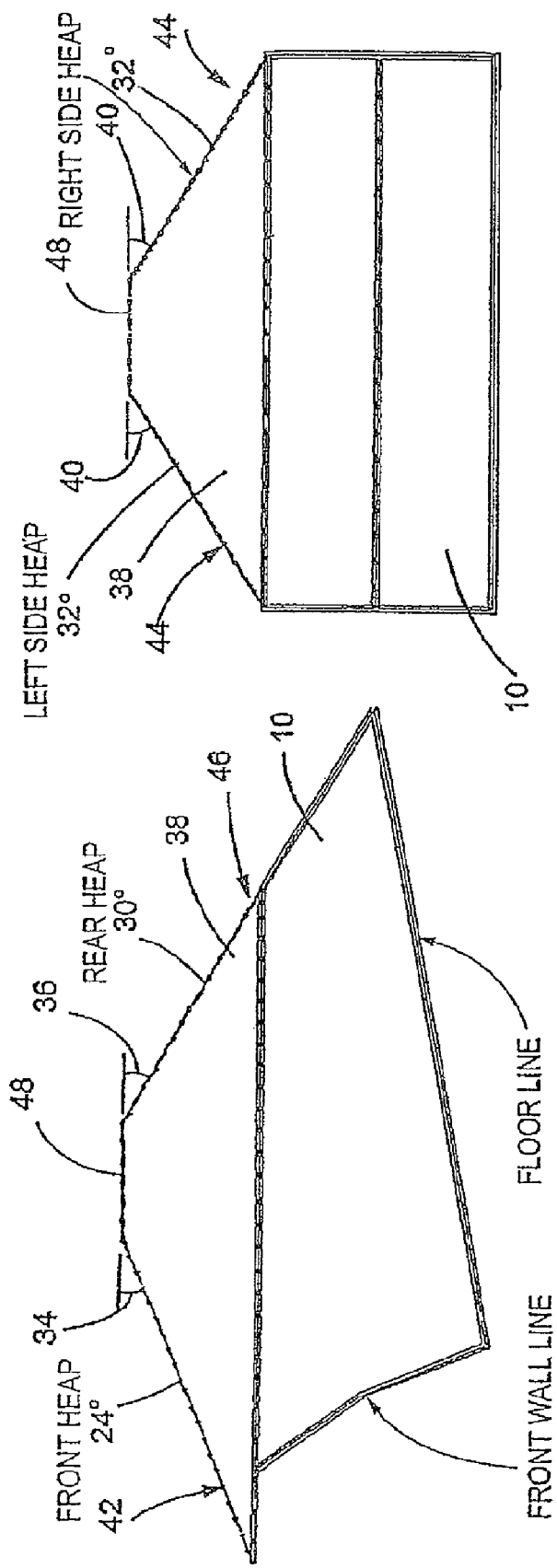
FIG. 8A is a side view of a dump body (outlined in triple solid lines) and a material heap (outline in broken lines) illustrating a process step in the sequence of steps for developing a three-dimensional heaped material load profile based on data collected from a specific haulage environment for use in the dump body design process of the present invention.
FIG. 8B is a rear view of the dump body (outlined in triple solid lines) and the material heap (outlined in broken lines) of FIG. 8A illustrating a process step in the sequence of steps for developing the three-dimensional heaped load profile.

The angle of the floor line 30, the lengths of the front slope line and floor line and the line defining the height of the sidewalls are adjusted as indicated by the arrows in FIG. 7 so that through an iterative process, the center of gravity of the load can be located as close as possible to the correct truck chassis 14 load center of gravity while maintaining the desired body volume. In adjusting the various parameters, it is preferable to keep the center of gravity of the load as low as possible in order to provide the best truck chassis stability. Accordingly, in the iterative process used to locate the center of gravity of the load in the desired position, it is generally preferable to focus on adjusting the height of the sidewalls and the length of the floor, versus rotating the rear of the floor. For example, either lowering the sidewalls and lengthening the floor to move the center of gravity rearward relative to the chassis 14 or raising the sidewalls and shortening the floor to move the center of gravity forward relative to the chassis 14. Using an iterative process, the width of the body 10 may also be adjusted with the slopes and lengths (within given parameters) of the floor and front slope in order to minimize the overall load height profile. While overall loading height of the dump body influences the size of the loading equipment that is required, lower overall dump body loading heights improve truck stability and lessen the need for larger loading equipment. Lower overall dump body loading heights also necessarily allow the load material to be dropped into the dump body from a lower point, thereby minimizing the impact force of the load material on the dump body. Obviously, the wider the body 10, the lower the center of gravity. As a practical limit, however, the body 10 generally should not be significantly wider than the overall width of the rear axle measured from the outer edges of the rear tires or as preset by the truck chassis manufacturer.

Next, based upon this approximate load profile 33 (e.g., shown in FIG. 6) and the data on the actual field haulage conditions, a three-dimensional model 38 (e.g. shown in FIGS. 8-15) of the load heap is developed which incorporates corner voids and the actual side angles of material repose 40 (e.g., 32°), front and rear angles of material repose 34, 36 (e.g. 24° and 30°) and a top of heaped load plateau 48 as measured from the actual field collected data. The process/steps used to develop the three-dimensional modeled heaped material load profile 38 are generally shown in FIGS. 8-15 with the outline of the truck body 10 shown in triple solid lines and the outline of the three-dimensional model 38 shown in broken lines. To account for corner voids (corners of the body where no hauled material is located) in the three-dimensional modeled load profile 38, the transition areas between the sides and the front and the rear of the load are modeled based on a gradual incremental blending of the side angle of material repose 40 to the front and rear angles of repose 34, 36 (which angles of repose may or may not be different. After the corner voids are so modeled, the modeled voids are then compared to the information collected in the field and the corner voids may then be adjusted so as to as closely as possible match the modeled corner voids with the actual field corner voids. As will be appreciated, the steps described in FIGS. 5-7 are used only to expedite the design process and are not necessary to the present invention. In particular, one can move directly to using the three-dimensional model 38 of the load heap (with the corner voids) and eliminate the steps shown in FIGS. 5-7.

To this end, in one preferred embodiment, the transition areas between the front 42 and the sides 44, and the rear 46 and the sides 44 of the three-dimensional load model 38 are divided into a number of equal segments as shown in FIG. 9. In the illustrated embodiment, the creation of the corner voids (e.g., FIG. 15) through the transitional blending of the angles of repose is only shown with respect to one of the front corners and one of the rear corners of the load. Of course, it will be appreciated that the same methodology described herein can be used to model the voids in the other corners of the load. In the illustrated embodiment, the boundaries of the transition areas between the sides 44 and the front 42 and rear 46 portions of the three-dimensional load model 38 form 90° angles defined by the flat top or plateau 48 (FIGS. 8 and 9), as defined by actual field operating data, of the load model 38, with each of the transition areas being divided into nine equal 100 segments. Planes 50 (FIG. 9) are established in each of these segments which extend at a respective angle of repose that allows, if required, an incremental change in the angle of repose through the corners from the sides 44 to the front 42 and rear 46 of the three-dimensional load model 38. In particular, the difference between the side and rear angles of repose, in this case 20, and the side and front angles of repose, in this case 80 is divided into nine equal incremental segments as shown in FIG. 9.

Figure 10B:
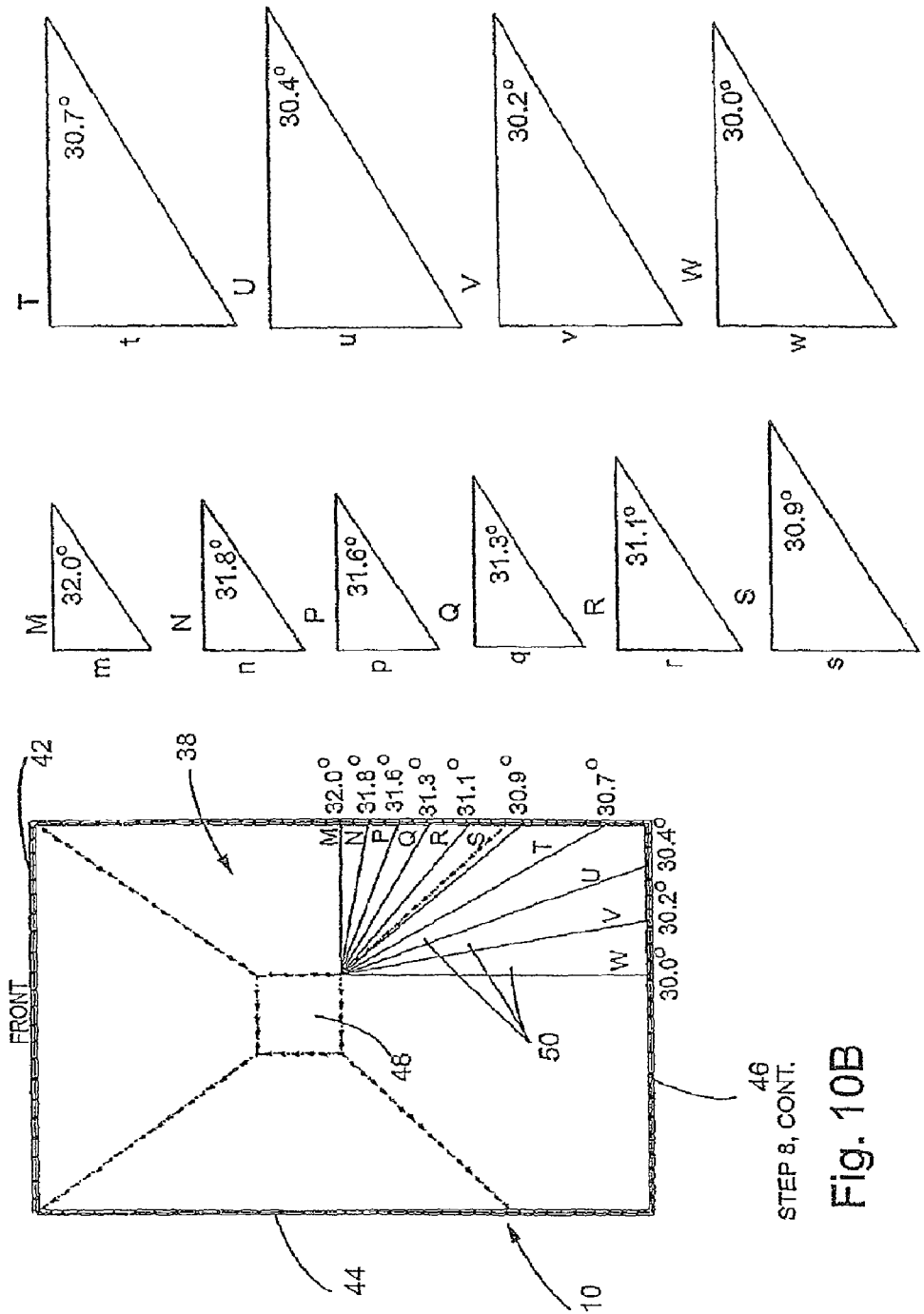

Each of these planes 50 is then extended using standard geometric principles until it intersects a portion of the dump body 10 such as the floor, side walls, front slope or canopy as shown in FIGS. 10a-c and 11. Specifically, as shown in FIGS. 10a-c, end points are established for each of these planes by using the values of the angles of material repose for each of the segments and the horizontal distance for each respective segment from the appropriate corner of the load plateau 48 to the perimeter of the dump body 10 to calculate the horizontal and vertical positions for the end points of the planes. Each plane 50 is then extended to its respective end points (FIG. 11). Next, any portion of the planes 50 which extends beyond the boundaries of the dump body 10 (referenced as 62, 64 and 66 in FIGS. 12-13) is then "cut-off" at the point at which it intersects the dump body to define the corner edges of the three-dimensional load model 38 as shown in FIGS. 12 and 13. The completed three-dimensional load heap profile 38 is shown in FIG. 14 and arranged in the dump body 10 in FIG. 15.

Once the three-dimensional modeling of the material heap is completed, including the modeling of the corner voids along with a subsequent comparison with the field gathered information, the center of gravity of the resulting three-dimensional load model 38 is then determined. This center of gravity is then compared to the center of gravity location (arrow 28) contemplated by the chassis design as shown in FIG. 16. If the center of gravity of the three-dimensional load model 38 is in close proximity to the center of gravity location contemplated by the chassis design then the design of the dump body 10 is complete. It is generally desirable to have the load center of gravity as close as is practical to the desired chassis location. While the distance will vary depending upon the relative length of the wheelbase of the truck, in one preferred embodiment the center of gravity will be considered sufficiently close to the desired location if it is within less than one inch (plus or minus) from the desired location. Due to the inherent design characteristics of off-highway trucks (in an empty condition an inordinate amount of the net weight of the truck is carried on the front axle), in most circumstances, the center of gravity of the three-dimensional load profile should not be allowed to be positioned forward of the center of gravity location contemplated by the chassis design.

In the event that the center of gravity of the three-dimensional load model 38 is not close enough to the desired location, in an iterative process a new three-dimensional profile of the heaped load is generated based on the data collected from the field loading/haulage environment. Through adjustment of the parameters of the dump body (e.g., the dump body floor angle, floor length and side height), the center of gravity of this new three-dimensional heaped load profile is moved through the iterative process until it is in close proximity to the desired location. These steps being repeated in an iterative fashion as necessary until the center of gravity of the three-dimensional load model is adjusted to be approximately coincident with the anticipated center of gravity contemplated by the design of the truck chassis 14.

The final design of the dump body 10 is shown in FIG. 17. In accordance with the present invention, the body 10 is custom modeled/designed based on specific field material, loading and hauling conditions and thus when the body is used in the field it will carry the desired volumetric hauling capacity and the center of gravity of the load will be in closer proximity to the desired center of gravity location than bodies designed using theoretical heap load profiles (see, e.g., FIG. 20).

FIGS. 18*a-b* are a flow diagram which illustrates the individual steps in the design process of the present invention which are described herein and shown in the drawings of FIGS. 1-17. For ease of reference, the steps in the flow diagram of FIGS. 18*a-b* are numbered to correspond with the numbering of the steps in FIGS. 1-17. As will be appreciated by those skilled in the art, steps 6 and 7 shown in FIGS. 18*a-b* can be considered optional in the design process.

Figure 19:
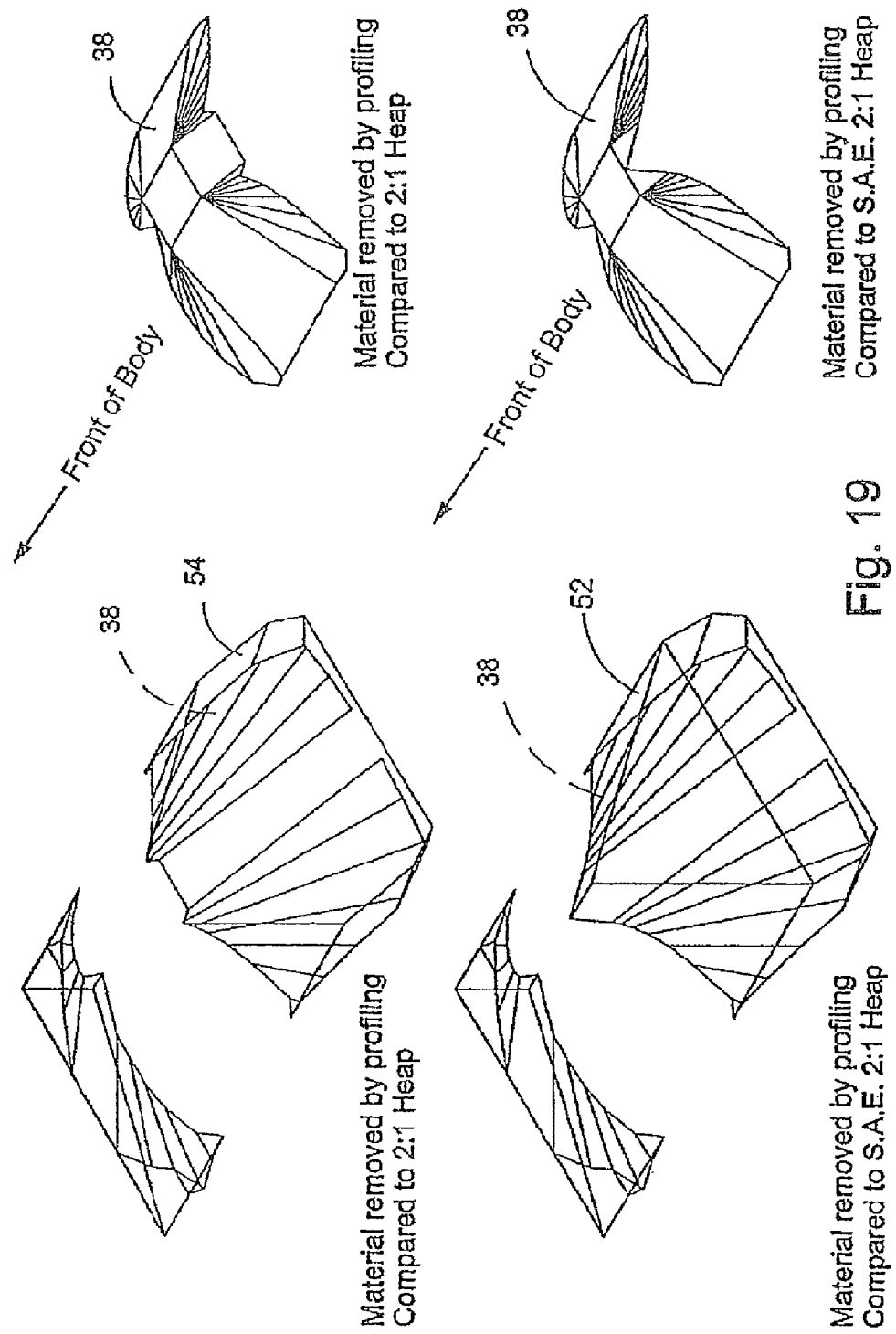
FIG. 19 is perspective drawing illustrating the differences between the three-dimensional heaped load profile of FIG. 15 and a load profile produced using a S.A.E. J 1363 (January 1985) 2:1 heap rating standard and a load profile produced using a 2:1 straight heap rating.

As will be appreciated, the use of actual angles of repose gathered from data taken from the actual field haulage conditions in which the dump body 10 will be employed can have a significant impact on the model of the load and thus ultimately on the design of the dump body. For example, as shown in FIG. 19, in the illustrated example of a load having actual 320 side, 240 front and 300 rear angles of repose, the three-dimensional load modeling process of the present invention results in a significant amount of material being removed from the front and rear and through part of the corners of the three dimensional load model 38 as compared to a standard 2:1 heap model 54 and a S.A.E. 2:1 heap model 52 as defined by S.A.E. Standard No. J 1263 (January 1985) (with the profiled three-dimensional model created using the present invention shown in broken lines and the S.A.E. 2:1 heaped model and standard 2:1 heaped model shown in solid lines). In this case, the three-dimensional load modeling process of the present invention also results in a significant amount of load material being added to the sides in the three-dimensional load model 38 as compared to the S.A.E. 2:1 heap and the standard 2:1 heap.

Figure 20:
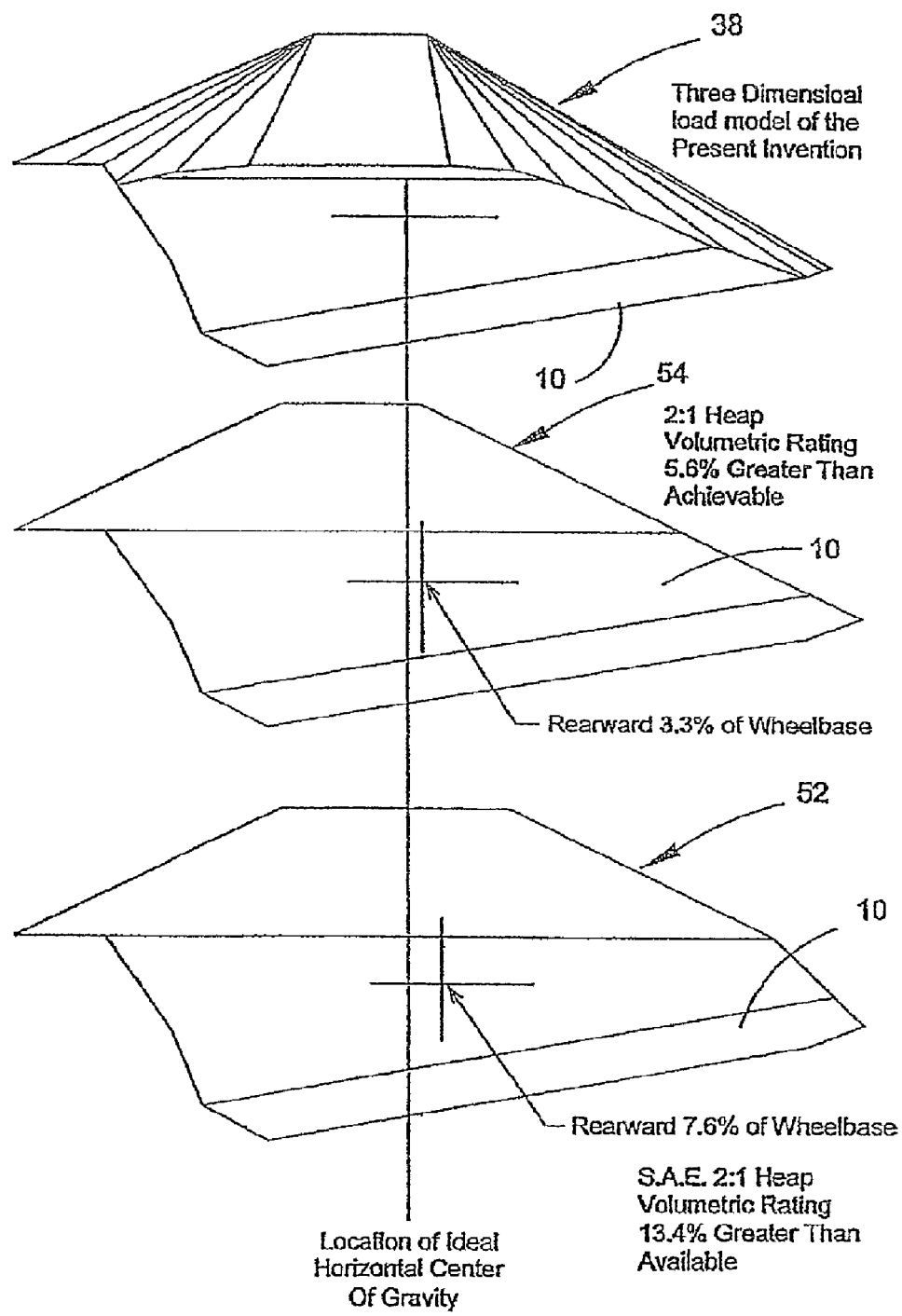
FIG. 20 is a comparison diagram illustrating the differences between the three-dimensional modeled material heap load profile of FIG. 15 as carried in a dump body and a straight 2:1 heap load profile and a S.A.E. 2:1 heap load profile as carried in the same dump body.

An example of how these differences in the load model can impact the location of the center of gravity of the load as it is carried in a dump body and the rated capacity or yardage of the dump body is shown in FIG. 20 (which is a side view of the load models shown in FIG. 19). More particularly, in FIG. 20, the location of the center of gravity and capacity of the three dimensional load model 38 as carried in a dump body is compared to the center of gravity and rated capacity of load models using the S.A.E. 2:1 heap standard model 52 or the 2:1 heap model 54 in the same dump body. As can be seen, the use of the S.A.E. 2:1 standard heap model 52 and the 2:1 heap model 54 results in the center of gravity being offset from the ideal location and in an overstatement of the truck body capacity. Of course, FIGS. 19 and 20 provide just one illustrative example of the differences between the three dimensional modeled heaped load profiles which result from using the process of the present invention as compared to heaped load models created using theoretical load profiles. Since the load modeling process of the present invention is dependent upon angle of repose data collected from the actual field haulage environment, the differences which result from using the load modeling process of the present invention as compared to the theoretical load profiling will vary on a case-by-case basis.

In view of the foregoing, it will be appreciated that, unlike the theoretical load profiling currently being done, the body and design process of the present invention takes into account the field material, loading and hauling conditions in which the dump body will be used and provides a method by which this information can be used in a meaningful manner in designing the dump body. Thus, a much more accurately designed dump body is produced resulting in improved body capacity and corresponding load retention, and proper placement of the load on the truck chassis and tires.

In accordance with a further aspect of the present invention, the floor 20 of the dump body 10 can be configured so as to help ensure that the load is placed in the proper position in the dump body 10 during the loading process. In particular, the rear edge 90 of the floor 20 of the dump body can have a rounded or curved configuration, as shown in FIG. 25, in which the length of the floor 20 is less near the sidewalls 16 than in the middle. The rear edge 90 of the floor 20 can be curved inward adjacent the sidewalls because of the rear corner voids in the heaped load as shown for example in FIG. 15. Curving the rear edge 90 of the floor 20 limits the space available at the rear of the dump body 10 for retaining the load and thereby helps prevent an off-center loading condition. If an operator attempts to load material too far rearward in the dump body 10, the material will simply fall off rear edge 90. The degree to which the rear edge 90 of the floor 20 can be curved is determined by examining the curve of the rear edge of the three dimensional heaped load profile 38 (see, e.g., FIG. 15). Specifically, the curve of the rear edge 90 can be configured to correspond with the curve of the rear edge of the three dimensional heaped load profile 38 (see FIG. 25). As will be appreciated, if a curved rear edge 90 is used for the floor 20, the sidewalls 16 are then modified to follow the curve of the floor 20.

According to another aspect of the present invention, for situations in which a relatively large capacity cable shovel bucket will be used to load material into the dump body, the dump body 10 can be designed with a relatively wider inside body width than conventional dump bodies in order to substantially reduce the impact force of the falling load and ensure that the load is properly placed within the dump body. Specifically, as the size and capacity of the buckets on cable shovels has increased, it has become possible to fill a dump body to capacity in four or less passes with the shovel bucket. However, using such large capacity loading buckets to load dump bodies has led to loads being improperly placed within the dump body and substantial increases in the impact force caused by the material as it drops into the dump body.

Figure 23:
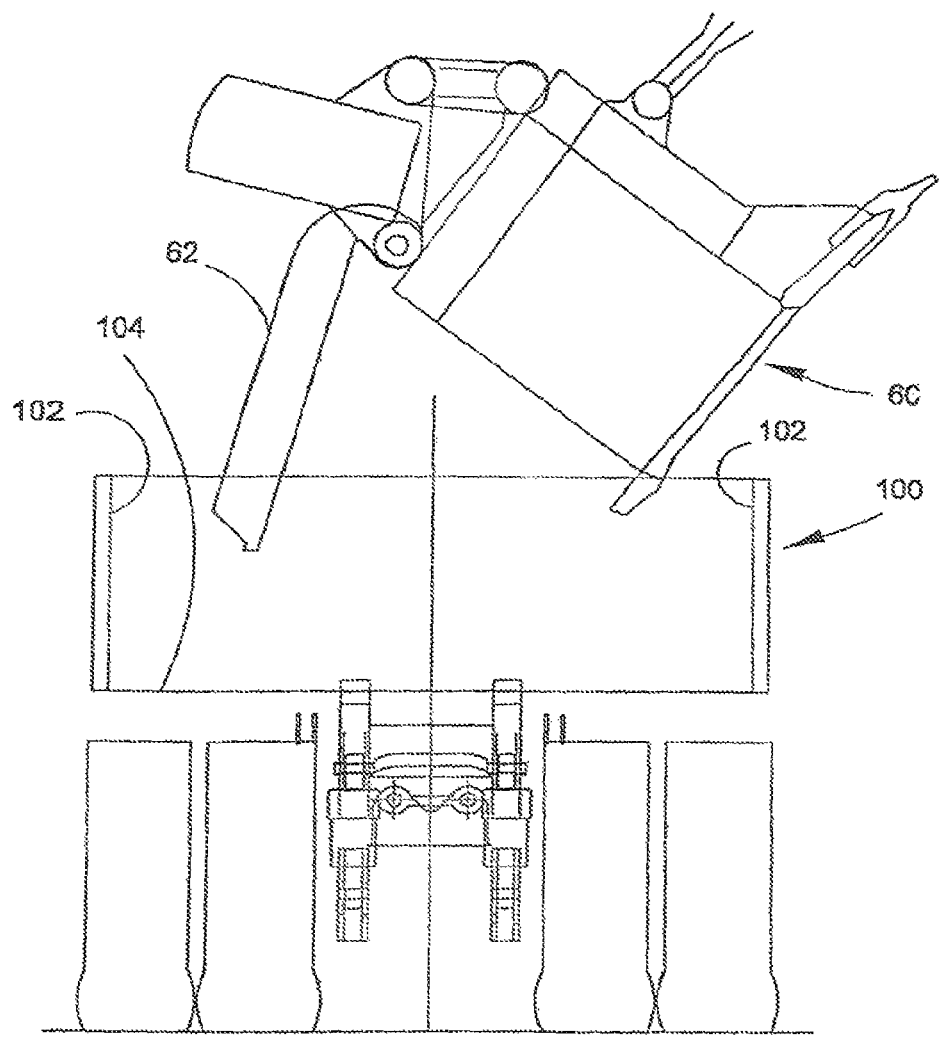
FIG. 23 is an end view of a prior art off-highway dump body being loaded by a large-capacity cable shovel or bucket.

As explained above, cable shovel buckets 60 (FIGS. 23-24) have a swinging door or gate 62 which will swing towards one sidewall of the dump body when opened to allow the material contained in the bucket to drop into the dump body. Accordingly, during a loading operation, the shovel operator must be careful to give sufficient clearance to the sides of the dump body 10 so that the gate 62 will not collide with the sidewall of the dump body when the gate is released. Because conventional dump bodies provided by off-highway truck manufacturers are relatively narrow, operators of large capacity loading buckets must position the bucket relatively close to one of the sidewalls of the dump body to ensure that the swinging gate does not swing into the opposing sidewall when it is released. For example, FIG. 23 is a scaled drawing showing one of the new large-capacity buckets 60 being used to load a conventional relatively narrower dump body 100. As will be appreciated, it is very difficult and time consuming to properly position a large-capacity bucket 60 with respect to a conventional dump body 100. Moreover, since the bucket 60 must be positioned relatively close to one of the sidewalls 102 of the dump body 100, the material is discharged in an off-center position relative to the dump body leading to improper loading of the dump body and truck chassis. However, if the bucket operator attempts to the place the load in the center of the dump body 100, the gate when it is released 62 will swing into the sidewall 102 of the dump body.

Additionally, when loading conventional dump bodies with large capacity buckets, the clearance between the floor 104 of the dump body 100 and the swinging gate 62 in the freed position cannot be minimized because the operator must ensure that the bucket does not come into contact with the sidewalls 102 of the dump body. As a result, the load must be dropped from the bucket 60 at a relatively large distance above the floor 104 of the dump body 100. Because of the extremely large capacity of these large buckets, the dropping material produces a very substantial impact force when it contacts the floor of the dump body. This impact force significantly increases the wear on the dump body and can severely jar the operator of the truck.

Figure 24:
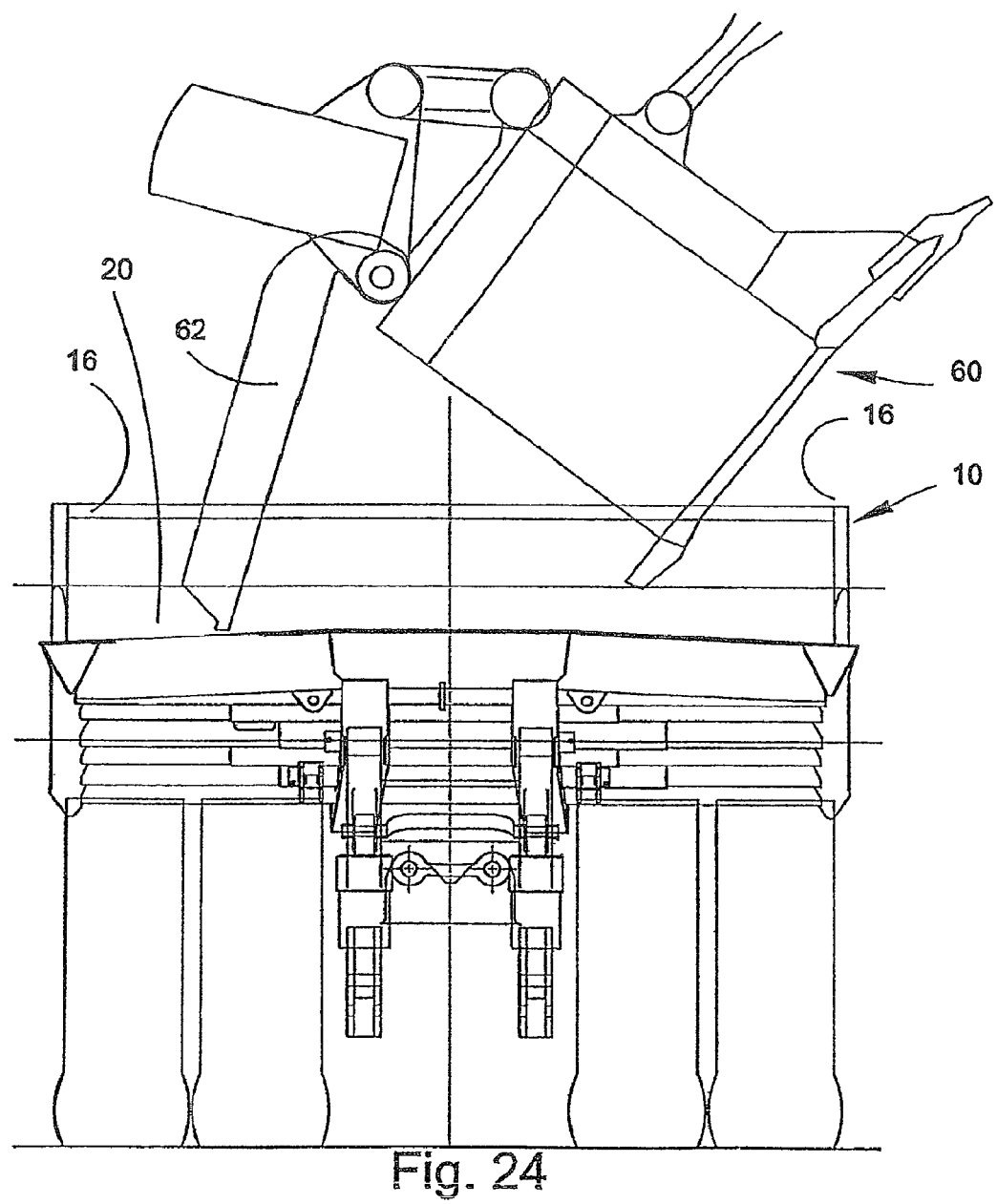
FIG. 24 is an end view of a dump body of the present invention being loaded by a large-capacity cable shovel or bucket.

In contrast to conventional loading operations involving prior art dump bodies and large capacity buckets, the present invention provides a method by which material can be loaded from a minimal height substantially into the center of a dump body 10 using a large capacity bucket 60 whose volumetric capacity is approximately ¼ or more than that of the dump body 10. As shown in FIG. 24, this is accomplished by using a relatively wider dump body 10 that has relatively lower sidewalls 16 than the similar capacity dump bodies conventionally provided by off-highway truck manufacturers. This allows a bucket operator to bring the bucket 60 into a substantially lower position in which just enough clearance is provided from the floor 20 of the dump body for operation of the swinging gate 62 before discharging the load from the bucket. In particular, using a relatively wider dump body 10, enables a shovel operator to lower the bucket 60 to a position that: (1) substantially minimizes the clearance between the floor 20 of the dump body 10 and the swinging gate 62 so as to minimize the impact force of the dropping load and (2) allows the material to be discharged substantially in the center of the dump body 10 while (3) allowing the swinging gate 62 to clear the sidewalls 16 of the dump body as it swings through an arc after it is freed. Thus, the method of the present invention results in a more balanced load on the dump body and a substantially reduced impact force from the discharge of the bucket load.

All of the references cited herein, including patents, patent applications, and publications, are hereby incorporated in their entireties by reference.

While this invention has been described with an emphasis upon preferred embodiments, it will be obvious to those of ordinary skill in the art that variations of the preferred embodiments may be used and that it is intended that the invention may be practiced otherwise than as specifically described herein. Accordingly, this invention includes all modifications encompassed within the spirit and scope of the invention as defined by the following claims.

What is claimed is:

1. A method of loading material into a dump body of a truck using four or less passes of a loading bucket, the dump body having opposing sidewalls and a floor, where the opposing sidewalls are spaced relatively wider than conventional dump bodies of similar volumetric capacity, and the loading bucket having a door at a lower end thereof that when free, swings open and allows the material contained in the loading bucket to drop into the dump body, the method comprising:
   for a first pass of the loading bucket whose volume is substantially ¼ or more than a volumetric capacity of the dump body,
   (a) positioning the loading bucket over the dump body so that material released from the loading bucket is distributed on the floor of the body to be centered between the opposing sidewalls of the body;
   (b) lowering the loading bucket while maintaining the position that allows the distribution of the material in the body to be centered between the opposing sidewalls when released from the loading bucket;
   (c) releasing the door of the bucket and freeing the material held in the bucket to drop into the dump body when the bucket is at a height above the floor that allows the door of the loading bucket to swing openly toward the floor and one of the opposing sidewalls of the body without interference with the opposing sidewalls and the floor of the dump body, where the height of the bucket is such that if the bucket was positioned off-center between the opposing sidewalls, the door of the bucket would collide with the said one of the opposing sidewalls when released;
   filling the dump body with the material and to capacity within three or less additional passes of the loading bucket; and
   dumping the material from the rear of the truck such that the material is deposited behind the truck.

2. The method of claim 1 wherein second and subsequent passes of the loading bucket are positioned to drop material from the bucket (1) at a location approximately centered between the opposing sidewalls, (2) at a height over the floor that substantially minimizes a distance the material falls and (3) without the sidewalls interfering with the door when the door is released and the material is freed to fall.

3. A haulage body for mounting to a truck dimensioned to be filled to capacity with material in four or less passes of a loading shovel whose loading bucket includes a hinged door that swings open and releases the material for loading into the haulage body, the haulage body comprising:

a member forming a hinge joint with a chassis of the truck such that the haulage body pivots to discharge the material of a load from a back of the truck such that the material is deposited behind the truck;

opposing sidewalls each having a height (h);

a floor having a width (w) defined by a spacing of the opposing sidewalls, which is a wider spacing of the opposing sidewalls than the spacing of the sidewalls in conventional dump bodies of similar volumetric capacity, and the width (w) and the height (h) and other dimensions of the body defining a haulage volume that is four or less times a volume capacity of the loading bucket; and a dimensional relationship between the height (h) of each of the opposing sidewalls and the width (w) of the floor that allows the door of the loading bucket to open and release the material into the body for at least a first pass of the loading shovel without the door colliding with one of the opposing sidewalls and the floor when the loading bucket is both (1) positioned such that the released material targets an area on the floor centered between the opposing sidewalls and (2) at an elevation over the floor that would cause the opening of the door to collide with the said one of the opposing sidewalls if the bucket is moved laterally at the elevation toward one of the sidewalls.

4. The haulage body of claim 3 wherein the dimensional relationship between the height (h) of each of the opposing sidewalls and the width (w) of the floor allows the door of the loading bucket to be positioned on second and subsequent passes of the loading bucket to drop material from the bucket at a location that (1) distributes the material into the body to be approximately centered between the opposing sidewalls and (2) substantially minimizes a distance the material falls when released from the loading bucket, without a sidewall or previously loaded material interfering with the opened door.

5. A system for moving material, the system comprising:

a truck carrying a dump body having opposing sidewalls spaced relatively wider apart than conventional dump bodies of similar volumetric capacity;

a hinge joint securing the dump body to a chassis of the truck such that the dump body pivots to discharge material from a back of the truck such that the material is deposited behind the truck;

a loading bucket having a volumetric capacity that is approximately or more than the volumetric capacity of the dump body such that the dump body is loaded to capacity in four or less passes of the loading bucket;

a door of the loading bucket that swings between closed and opened positions which, when opened, releases material contained in the loading bucket to fall freely from the bucket; and the opposing sidewalls each of a height (h) and a floor of a width (w) comprising the dump body whose relative dimensions of the height (h) and width (w) enable the loading bucket to be positioned when releasing material from the loading bucket during a first pass of loading material into the body such that (1) the material targets a location on the floor that is centered between the opposing sidewalls and (2) a height of the bucket's position above the floor is such that lateral repositioning of the bucket at the height results in the opening of the door of the loading bucket colliding with one of the sidewalls.

6. The system of claim 5 wherein the dimensional relationship between the height (h) of each of the opposing sidewalls and the width (w) of the floor allows the door of the loading bucket to be positioned on second and subsequent passes of the loading bucket to drop material from the bucket at a location that (1) distributes the material into the body to be approximately centered between the opposing sidewalls and (2) substantially minimizes a distance the material falls when released from the loading bucket, without a sidewall or previously loaded material interfering with the opened door.

* * * * *

UNITED STATES PATENT AND TRADEMARK OFFICE
CERTIFICATE OF CORRECTION

| | |
|---|---|
| PATENT NO. | : 8,113,763 B2 |
| APPLICATION NO. | : 12/106794 |
| DATED | : February 14, 2012 |
| INVENTOR(S) | : LeRoy G. Hagenbuch and Philip T. Brinkman |

Page 1 of 1

It is certified that error appears in the above-identified patent and that said Letters Patent is hereby corrected as shown below:

At column 14, line 13, after the word "approximately" insert --1/4--.

Signed and Sealed this
Fourteenth Day of August, 2012

David J. Kappos
*Director of the United States Patent and Trademark Office*